(12) United States Patent
Kawashima

(10) Patent No.: US 6,780,574 B2
(45) Date of Patent: Aug. 24, 2004

(54) MULTIPLE EXPOSURE METHOD

(75) Inventor: Miyoko Kawashima, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 24 days.

(21) Appl. No.: 09/796,541

(22) Filed: Mar. 2, 2001

(65) Prior Publication Data

US 2001/0036604 A1 Nov. 1, 2001

(30) Foreign Application Priority Data

Mar. 2, 2000 (JP) .......................... 2000-057707
Feb. 26, 2001 (JP) .......................... 2001-050623

(51) Int. Cl.$^7$ ................................ G03F 7/00
(52) U.S. Cl. .................. 430/394; 430/312; 430/396
(58) Field of Search ......................... 430/312, 394, 430/396, 322

(56) References Cited

U.S. PATENT DOCUMENTS

| 5,424,154 | A | * | 6/1995 | Borodovsky | .................. | 430/5 |
| 5,759,744 | A | * | 6/1998 | Brueck et al. | .............. | 430/312 |
| 5,766,829 | A | * | 6/1998 | Cathey et al. | .............. | 430/313 |
| 5,912,727 | A | * | 6/1999 | Kawai | .......................... | 355/67 |
| 6,351,304 | B1 | * | 2/2002 | Kawashima et al. | .......... | 355/55 |
| 6,473,158 | B2 | | 10/2002 | Uzawa | ........................ | 355/53 |

FOREIGN PATENT DOCUMENTS

| EP | 0 915 384 A2 | 11/1998 |
| EP | 0 939 343 A1 | 2/1999 |
| JP | 11-233429 | 8/1999 |

OTHER PUBLICATIONS

" Optics for Microlithography"—B.W.Smith in "Microlithography—Science and Technology"; pp 171–270, eds J.R.Sheats and B.W.Smith; Marcel Dekker (NY), 1998.*

* cited by examiner

Primary Examiner—Mark F. Huff
Assistant Examiner—Kripa Sagar
(74) Attorney, Agent, or Firm—Fitzpatrick, Cella, Harper & Scinto

(57) ABSTRACT

An exposure method in which a multiple exposure process including a first exposure for a first pattern and a second exposure for a second pattern is performed by use of a projection optical system to thereby resolve a desired pattern. The exposure method includes setting a numerical aperture NA1 of the projection optical system for the first pattern exposure and setting a numerical aperture NA2 of the projection optical system for the second pattern exposure to be different from each other.

33 Claims, 19 Drawing Sheets

1ST-TIME
EXPOSURE:
PERIODIC
PATTERN

PERIODIC
PATTERN:
PHASE SHIFT
MASK

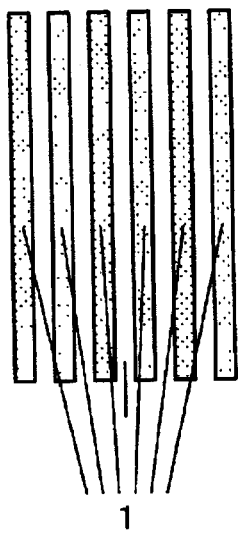
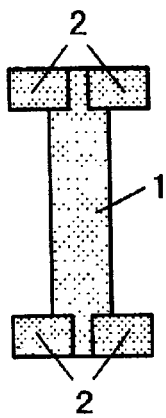
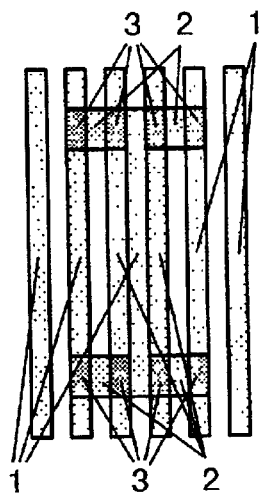
FIG. 1A  1ST-TIME EXPOSURE: PERIODIC PATTERN
FIG. 1B  2ND-TIME EXPOSURE: (MULTIPLE-VALUE) STANDARD PATTERN
FIG. 1C  DUAL EXPOSURE
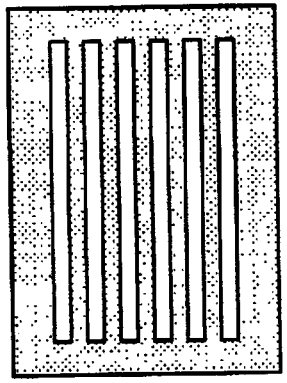
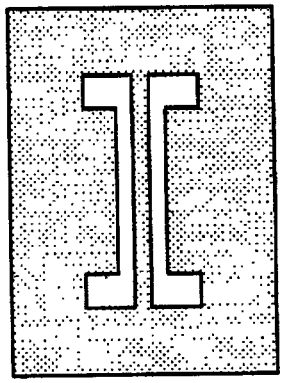
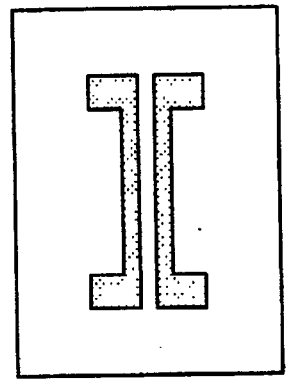
FIG. 2A  PERIODIC PATTERN: PHASE SHIFT MASK
FIG. 2B  STANDARD PATTERN: LIGHT TRANSMISSION TYPE MASK
FIG. 2C  STANDARD PATTERN: LIGHT BLOCKING TYPE MASK

1ST-TIME EXPOSURE:
PERIODIC PATTERN
EXPOSURE

2ND-TIME EXPOSURE:
STANDARD (MULTIPLE
VALUE) EXPOSURE $NA = \sin\theta$ $NAr = \sin\theta r$

1ST-TIME EXPOSURE: PERIODIC PATTERN EXPOSURE

2ND-TIME EXPOSURE: STANDARD (MULTIPLE VALUE) EXPOSURE

PUPIL (NA)

NAr

PUPIL

1ST-TIME EXPOSURE: PERIODIC PATTERN EXPOSURE

2ND-TIME EXPOSURE: STANDARD (MULTIPLE VALUE) EXPOSURE

ILLUMINATION LIGHT

NA

ILLUMINATION LIGHT

NAr

LIGHT BLOCKING PATTERN

PHASE SHIFT MASK
PERIODIC PATTERN

LIGHT BLOCKING PATTERN

TRANSMISSIVE PATTERN

IMAGE BY BINARY MASK

IMAGE BY PHASE SHIFT MASK

SUPERPOSITION OF STANDARD EXPOSURE (NA=0.48, σ=1.0)
& PERIODIC PATTERN EXPOSURE:LINEWIDTH ERROR=0.13μm
(K1=0.31, POSITIVE RESIST)

SINGLE EXPOSURE OF STANDARD EXPOSURE ONLY
(NA=0.60, σ=0.80) : HORIZONTAL LINEWIDTH
ASYMMETRY 0.20μm (K1=0.5, POSITIVE RESIST)

SUPERPOSITION OF STANDARD EXPOSURE (NA=0.60, σ=0.80) & PERIODIC PATTERN EXPOSURE: HORIZONTAL LINEWIDTH ASYMMETRY 0.13 μm (K1=0.31, POSITIVE RESIST)

SUPERPOSITION OF STANDARD EXPOSURE (NA=0.60, σ=0.80) & PERIODIC PATTERN EXPOSURE: HORIZONTAL LINEWIDTH ASYMMETRY 0.13 μm (K1=0.31, POSITIVE RESIST)

MULTIPLE EXPOSURE METHOD

FIELD OF THE INVENTION AND RELATED ART

This invention relates to an exposure method, an exposure apparatus and a device manufacturing method and, more particularly, to a multiple exposure technology for lithographically printing a very fine circuit pattern on a photosensitive substrate. The present invention is suitably usable, for example, in the production of various patterns to be used for various devices and micro-mechanics such as semiconductor chips (e.g., ICs or LSIs), display devices (e.g., liquid crystal panels), detecting devices (e.g., magnetic heads), or image pickup devices (e.g., CCDs), for example.

Generally, the manufacture of microdevices such as ICs, LSIs or liquid crystal panels through photolithographic processes uses a projection exposure method and a projection exposure apparatus wherein a circuit pattern formed on a photomask or a reticle (hereinafter, "mask"), for example, is projected to and thus transferred (photoprinted) to a photosensitive substrate such as a silicon wafer or a glass plate (hereinafter, "wafer"), for example, through a projection optical system.

With increasing density (integration) of these devices, further miniaturization of a pattern to be transferred to a wafer is required. Namely, improvements in the resolution as well as enlargement of the area of a single chip on the wafer are required. In this respect, projection exposure apparatuses and projection exposure methods which are the core of the wafer micro-processing technology are required to assure formation of an image of a size (linewidth) of 0.1 micron or less in a wider region, particularly, a circuit pattern of 80 nm or less.

FIG. 33 is a schematic view of a general structure of a projection exposure apparatus. Denoted in the drawing at 191 is an excimer laser which is an exposure light source. Denoted at 192 is an illumination optical system, and denoted at 193 is illumination light. Denoted at 194 is a mask, and denoted at 195 is object-side exposure light emitted from the mask 194 and impinging on a reduction projection optical system 196. Denoted at 197 is image-side exposure light emitted from the optical system 196 and impinging on a photosensitive substrate 198 which is a wafer. Denoted at 199 is a substrate stage for holding the photosensitive substrate.

The laser light emitted from the excimer laser 191 is directed by a guiding optical system to the illumination optical system 192, by which the light is adjusted and transformed into the illumination light 193 having a predetermined light intensity distribution, orientation distribution, opening angle (numerical aperture NA) and the like. The illumination light 193 illuminates the mask 194. The mask 194 has a fine pattern corresponding to a fine pattern to be produced on the wafer 198. The mask pattern is formed on a quartz substrate by use of chromium, for example, and the pattern has a size corresponding to the inverse of the projection magnification of the projection optical system, that is, 2×, 4× or 5×, for example. The illumination light 193 is transmissively diffracted by the fine pattern of the mask 194, whereby object-side exposure light 195 is provided. The projection optical system 196 functions to transform the object-side exposure light 195 into image-side exposure light 197 for imaging the fine pattern of the mask 194 upon the wafer 198 in accordance with the above-described projection magnification and with a sufficiently small aberration. As best seen in an enlarged view at the bottom of FIG. 33, the image-side exposure light 197 is converged upon the wafer 198 with a predetermined numerical aperture NA (=sinθ), whereby an image of the fine pattern is produced on the wafer 198. When fine patterns are to be produced sequentially on different regions of the wafer, each corresponding to single or plural chips, the substrate stage 199 moves stepwise along the image plane of the projection optical system, to change the position of the wafer 198 with respect to the projection optical system 196. Denoted at 200 is a pupil position of the projection optical system.

With currently prevailing projection exposure apparatuses having an excimer laser as a light source, such as described above, however, it is not easy to produce a pattern of a linewidth of 0.15 micron or narrower.

In the projection optical system 196, there is a limit of resolution due to the tradeoff between the depth of focus and the optical resolution attributable to the exposure wavelength (wavelength used for the exposure process). The resolution R of a resolving pattern and the depth of focus DOF in a projection exposure apparatus can be expressed by Rayleigh's equations such as equations (1) and (2) below.

$$R = k_1(\lambda/NA) \tag{1}$$

$$DOF = k_2(\lambda/NA^2) \tag{2}$$

where λ is the exposure wavelength, NA is the image-side numerical aperture of the projection optical system which represents the brightness thereof, and $k_1$ and $k_2$ are constants which are determined by the developing process characteristic of the wafer 198, for example, and which are generally about 0.5 to 0.7. From equation (1) above, it is seen that improvements in resolution (making the value of resolution R smaller) can be attained by enlarging the numerical aperture NA (NA enlargement). Also, from equation (2), it is seen that improvements in resolution anyway necessitate shortening the exposure wavelength (wavelength shortening) because the projection optical system 196 should have a certain value of the depth of focus DOF in the practical exposure such that the NA enlargement cannot be done unlimitedly.

However, the wavelength shortening encounters a critical problem. Namely, there is no glass material usable for the projection optical system 196. Most glass materials have a substantially zero transmission factor with respect to the deep ultraviolet region. Fused silica is a glass material which can be produced by a special process, for use in an exposure apparatus having an exposure wavelength of about 248 nm. However, even the transmission factor of fused silica largely decreases with respect to the exposure wavelength of 193 nm or shorter. In the exposure wavelength region of 150 nm or shorter, corresponding to a fine pattern of 0.15 micron or less, development of a practical glass material is very difficult. Further, glass materials to be used in the deep ultraviolet region should satisfy not only the transmission factor but also various conditions such as durability, refractive index uniformness, optical distortion, and machining easiness, for example. In consideration of these factors, development of practical glass materials is difficult to accomplish.

As described above, in conventional projection exposure method and projection exposure apparatuses, the wavelength shortening to an exposure wavelength of about 150 nm or less is necessary to enable formation of a pattern of 0.15 micron or narrower on a wafer, whereas there is no practical glass material to be satisfactorily used in such a wavelength region.

A dual exposure method has been proposed by the same assignee of the subject application, which method comprises a combination of a dual-beam interference exposure and a multiple-value exposure, to enable formation of a pattern of 0.15 micron or less with use of a currently available exposure apparatus.

The dual exposure method is a method in which a multiple value exposure process based on an ordinary or standard exposure as well as a periodic pattern exposure process based on a dual beam interference exposure are performed without intervention of a development process. More specifically, a periodic pattern may be photoprinted with a level less than the exposure threshold level of a resist and, thereafter, a standard exposure process having a multiple level exposure amount distribution is performed. As regards the exposure amount by the standard exposure, different exposure amount distributions are produced in different small zones of the exposure pattern region (exposure region). Here, the exposure amount refers to an exposure amount on a resist. The exposure amount distribution may include a multiple-value exposure amount distribution, that is, a region with an exposure amount not less than the resist exposure threshold value and a region with an exposure amount not greater than the same resist exposure threshold value.

Referring to an example of a gate pattern shown in FIG. 3, a circuit pattern (lithography pattern) to be produced by the exposure will be explained. The gate pattern of FIG. 3 has a smallest lateral linewidth of 0.1 micron, which is beyond the range of resolution by the standard exposure process. On the other hand, it has a smallest longitudinal linewidth of 0.2 micron or more, which is within the range of resolution by the standard exposure process. In accordance with the dual exposure method, as regards a two-dimensional pattern, as above, having a smallest linewidth pattern for which a high resolution is required only with respect to a one-dimensional direction (i.e., lateral direction), the periodic pattern exposure based on the dual-beam interference exposure, for example, may be performed with use of only a periodic pattern in a one-dimensional direction in which a high resolution is required.

FIGS. 1A–1C show exposure amount distributions in each step of the dual exposure process. Numerals in these drawings each denotes an exposure amount of the resist. FIG. 1A shows an exposure amount of the resist. FIG. 1A shows an exposure amount distribution provided by a periodic exposure pattern, wherein repetition patterns are formed in a one-dimensional direction. The exposure amount at blank (white) portions other than the pattern is zero. The pattern portion has an exposure amount of 1.

FIG. 1B shows an exposure amount distribution provided by a multiple-value standard exposure. The exposure amount at blank portions other than the pattern is zero. The pattern portion has a multiple-value exposure amount distribution (dual-value in this example) of 1 and 2.

When these exposures are performed (dual exposure) without intervention of a development process, the result is that a distribution corresponding to the sum of these exposure amounts is produced on the resist, whereby an exposure amount distribution such as shown in FIG. 1C is provided. Here, when the exposure threshold value of the resist is between 1 and 2, the portion with an exposure amount larger than 2 is sensitized (printed) such that a pattern depicted by a thick line in FIG. 1C can be produced, with a development process. The exposure pattern which is outside the thick-line portion and which is provided by the periodic pattern exposure has an exposure amount less than the resist exposure threshold value and, therefore, it disappears through the development process.

As regards the portion where exposure amounts by the standard exposure and being not greater than the resist exposure threshold value are distributed, those regions where the sum of the exposure patterns provide by the standard exposure and the periodic pattern exposure is not less than the resist exposure threshold value are developed into a pattern by the development process. Thus, at the portion where the exposure patterns provided by the standard exposure and the periodic pattern exposure are superposed one upon another, an exposure pattern having the same resolution as that of the exposure pattern of the periodic pattern exposure is produced.

As regards the exposure pattern region where exposure amounts provided by the standard exposure and being not less than the resist exposure threshold are distributed, although exposure patterns of the standard exposure and the periodic pattern exposure are superposed, an exposure pattern having the same resolution as the exposure pattern of the standard exposure is produced.

FIGS. 2A–2C show patterns and masks for producing exposure amount distributions of FIGS. 1A–1C. FIG. 2A shows a pattern and a mask for producing a repetition pattern only in a one-dimensional direction in which a high resolution is required. For example, a Levenson type phase shift mask may be used. If a Levenson type mask is used, blank (white) portions and gray portions in the drawing have mutually inverse phases. Due to the effect of the phase inversion, a periodic exposure pattern of high contrast can be produced through a dual-beam interference exposure process. The mask is not limited to the Levenson type phase shift mask. Any type of mask may be used provided that an exposure amount distribution such as above can be produced thereby.

This exposure pattern has a period of 0.2 micron, for example, and it comprises a line-and-space pattern having a linewidth of 0.1 micron (each line and each space). The exposure amount distribution shown in FIG. 1A is produced by this.

As regards a pattern and a mask for forming a multiple-value pattern, a mask having formed thereon a pattern being analogous to a circuit pattern to be produced finally is used. In this case, a mask having a gate pattern formed thereon, as shown in FIG. 2B, is used.

As described hereinbefore, the portion of a gate pattern which comprises a very fine line of 0.1 micron width is a pattern narrower than the resolution of the standard exposure. As a result, two narrow-line portions are not resolved, but a uniform low-intensity distribution is produced. As compared therewith, patterns at the top and bottom ends of the gate pattern can be resolved as high-intensity patterns because the linewidth thereof is inside the resolution range of the standard exposure.

Thus, when the pattern and the mask of FIG. 2B are printed, the result is that a multiple-value exposure amount distribution such as shown in FIG. 1B is produced.

In this example, the pattern to be produced is of a light transmission type. A light blocking type pattern can be produced by use of a mask such as shown in FIG. 2C. Namely, a light blocking type pattern can be formed by using a mask arranged so that light is transmitted through a region other than the pattern, whereas light is blocked by the pattern.

In the case of a light blocking type pattern, a pattern beyond the resolution blocks the light and the exposure amount distribution becomes zero, whereas a fine pattern less than the resolution does not completely block the light, and an exposure amount about a half of the exposure amount distribution around the pattern is provided. As a result, a multiple-value exposure amount distribution is produced.

The principle of the dual exposure process can be summarized as follows.

1. The periodic pattern exposure region not fused with the exposure pattern of standard exposure, that is, the periodic pattern not greater than the resist exposure threshold value, disappears with the development process.
2. As regards the pattern region of standard exposure having been exposed with an exposure amount not greater than the resist exposure threshold value, an exposure pattern corresponding to a portion of a desired circuit pattern to be produced and having the same resolution as that of the periodic pattern exposure, is produced. This exposure pattern is determined on the basis of the combination of exposure patterns to be provided by the standard exposure and the periodic pattern exposure, respectively.
3. As regards the pattern region of standard exposure having been exposed with an exposure amount not less than the resist exposure threshold value, an exposure pattern corresponding to the mask pattern is produced.

The multiple exposure method described above has an additional advantage. That is, if the periodic pattern exposure for which a highest resolution is required is required is performed through the dual-beam interference exposure using a phase shift mask, for example, a large depth of focus is obtainable. Further, as regards the order of the periodic pattern exposure and the standard exposure, the periodic pattern exposure is made first in the above-described examples, the order may be reversed or, alternatively, these exposures may be made at the same time.

In the multiple exposure procedure such as described above and as regards the exposure of a large pattern not less than the resolution, being included in the standard exposure pattern, there are a portion to be superposed with a periodic pattern and a portion not superposed therewith. These portions should be similarly formed into a pattern. Thus, concerning a large pattern not less than the resolution, the standard exposure may be dominant.

However, with such standard exposure, a large depth of focus may not be obtainable for a pattern of a size near the resolution. There are cases wherein a fine pattern can be resolved with a large depth, by use of the periodic pattern exposure.

Namely, depending on the exposure condition, there may be cases wherein, as a result of a combination of the standard exposure and the periodic pattern exposure, since the depth of focus with a large pattern not less than the resolution of the standard exposure is smaller than that of a fine line less than the resolution of the periodic pattern exposure, a large pattern is degraded more, by defocus, than that of the fine pattern.

Degradation of the image performance due to aberration is particularly serious in the point of pattern shift mainly caused by asymmetric aberration. As the pattern becomes close to the limit resolution, it becomes more serious in dependence upon the linewidth. Further, there is lateral (horizontal) linewidth asymmetry which becomes very notable with a linewidth $k_1=0.5$ or less, although this has not yet been considered as a problem. Here, the linewidth R is expressed by $k_1$, as divided by ($\lambda$/NA). Hereinafter, the linewidth will be expressed by $k_1$.

Further, because of a proximity effect becoming larger and because of the difference between the linewidth of a pattern at the central portion of the line-and-space pattern and a pattern being almost isolated, the dispersion of the linewidth becomes large.

When the linewidth $k_1$ is not greater than 0.5, the image performance is degraded more. However, because the lateral linewidth asymmetry becomes large, the lateral linewidth asymmetry can be used as one evaluation reference for the image performance.

Thus, by using a gate pattern of FIG. 12 with a two-line pattern, as an evaluation pattern, the lateral linewidth asymmetry may be evaluated and the image performance may be expressed thereby.

"lateral linewidth asymmetry"=("left linewidth"–"right linewidth")/("predetermined linewidth")×100   (3)

Here, the predetermined linewidth means the linewidth of the original pattern. It may be a linewidth where no aberration is present. If there is an aberration, it may be an average of the left and right linewidths.

Now, while taking coma aberration as an example, degradation of the image performance will be described. When a wavefront aberration WA is expressed by using Zernike's coefficient Ci, we obtain:

$$WA=\Sigma CiUi(r, \theta) \quad (4)$$

Here, if the coordinate system of a pupil is expressed by polar coordinates r and $\theta$, a lower-order coma aberration component, for example, is:

$$C8(3r^3-2r)\sin\theta \quad (5)$$

As an example when the image performance is degraded by aberration, an exposure apparatus having a KrF excimer laser having a wavelength of $\lambda=0.248$ micron and a projection optical system of NA=0.60 and with a coma aberration of $c8=0.05\lambda$ is used to expose a pattern having two fine lines of $k_1=0.3$ as shown in FIG. 12 to form an image thereof on the wafer surface.

When a binary reticle of light transmission type with a single phase and having a pattern including two fine lines of 0.13 micron ($k_1=0.315$) such as shown in FIG. 14 is used to perform the exposure, an image such as shown in FIG. 20 is obtainable. Even if there is aberration, substantially no lateral asymmetry occurs. In fact, the asymmetry according to the definition of equation (3) was 2.75%. The illumination condition in that case was $\sigma=0.8$ in terms of the effective light source distribution on the pupil plane as shown in FIG. 13. However, only a contrast of 14% was obtained between the two lines, and they were not resolved.

When a phase shift reticle having two phases of 0 and $\pi$ and having a pattern with two fine lines of 0.13 micron ($k_1=0.315$) such as shown in FIG. 15 is used to perform the exposure, an image such as shown in FIG. 21 is obtainable. A contrast of 90% or higher was obtained between the two lines, but the shape was much degraded by aberration. The asymmetry according to equation (3) was as large as 30%. The illumination condition in that case was a $\sigma=0.3$.

In FIGS. 14 and 15, the black-painted portion depicts a portion where the light is blocked, while a blank (white) portion depicts a portion where the light is transmitted. Also, in the pattern shown in FIG. 15, two portions for transmitting light have phases being mutually inverted.

It is seen from the above that, in a process wherein the $k_1$ factor is small, aberration should be suppressed to prevent adverse influence to the image performance.

SUMMARY OF THE INVENTION

It is an object of the present invention to provide an exposure method, an exposure apparatus and/or a device manufacturing method by which satisfactory resolution is attainable with a multiple exposure process, by which, particularly, the depth of focus can be enlarged in accordance with a pattern to be resolved and with a required depth, and by which the influence of aberration to the image performance can be reduced even in a process where the $k_1$ factor is small.

In accordance with an aspect of the present invention, there is provided an exposure method in which a multiple exposure process including a first exposure for a first pattern and a second exposure for a second pattern is performed by use of a projection optical system to thereby resolve a desired pattern, characterized in that: a numerical aperture NA1 of the projection optical system for the first pattern exposure and a numerical aperture NA2 of the projection optical system for the second pattern exposure are made different from each other.

In one preferred form of this aspect of the present invention, for a common numerical aperture, the first pattern exposure may be performed with a substantially higher resolution and a substantially larger depth of focus, as compared with the second pattern exposure, and the numerical aperture NA2 for the second pattern may be made smaller than the numerical aperture NA1 for the first pattern.

The numerical aperture NA2 for the second pattern may satisfy a relation 0.7 NA1≦NA2<NA1.

The numerical aperture NA1 for the first pattern may be determined in accordance with the following equation:

$$NA1 = k_1(\lambda/R) \text{ where } k_1 \geq 0.25$$

wherein R is the length of a shorter one of a line and a space of a thinnest portion of the desired pattern, and $\lambda$ is the wavelength of light used for the first pattern exposure.

The numerical aperture NA1 for the first pattern may correspond to a largest numerical aperture of the projection optical system.

The first pattern exposure and the second pattern exposure may be performed with different coherence factors σ.

In the multiple exposure process, in accordance with a depth of focus required for resolution of the desired pattern, a combination of a coherence factor $\sigma_1$ and the numerical aperture NA1 of the projection optical system for the first pattern exposure and a combination of a coherence factor $\sigma_2$ and the numerical aperture NA2 of the projection optical system for the second pattern exposure may be set, respectively.

The coherence factor $\sigma_1$ for the first pattern exposure may be determined in accordance with a depth of focus required for resolution of a fine line of the width R.

For a fine line having a normalized linewidth $k_1$, obtainable by dividing the width R of the fine line by ($\lambda$/NA1), being not greater than 0.4, the coherence factor $\sigma_1$ may be made not greater than 0.3.

The numerical aperture NA2 for the second pattern may be determined in accordance with a linewidth of a pattern included in the second pattern, having a linewidth not smaller than the pitch of a periodic pattern of the first pattern and not being dependent upon the first pattern in the resolution.

The first pattern may be constituted by a periodic pattern only a thin portion of which is resolvable, while the second pattern may be constituted by a pattern having a thin portion which is not resolvable, such that, in combination of them, an influence of aberration of the projection optical system is reduced.

The first pattern exposure may use coherent illumination, while the second pattern exposure may use incoherent illumination.

The periodic pattern may include a thin portion corresponding to a thin portion of the desired pattern and a periodic pattern having periods, more than one period, defined at the opposite sides of the thin portion.

In the first pattern exposure, the following relations may be satisfied:

$k_1 \leq 0.4$ $k_2 \geq 0.5$ where $k_1$ is a value obtainable by dividing, by $\lambda$/NA1, the length R of a shorter one of a line and a space of the thin portion, and $k_2$ is a value obtainable by dividing a focus amount d by $\lambda/NA1^2$, wherein $\lambda$ is the wavelength of light used for the exposure.

When a phase shift mask is used for the first pattern exposure, the coherence factor $\sigma_1$ may be made not greater than 0.3.

The second pattern exposure may be based on a triple-beam interference imaging process.

The numerical aperture NA2 of the projection optical system for the second pattern exposure may satisfy a relation NA2≦0.4×($\lambda$/R) where $\lambda$ is the wavelength of light used for the exposure, and R is the linewidth.

The numerical aperture NA2 of the projection optical system for the second pattern exposure may satisfy a relation NA2≧0.5×($\lambda$/R2) where R2 is the linewidth of a portion of the desired pattern, excluding the thick portion not to be resolved by the second pattern exposure but to be resolved by the first pattern exposure, and $\lambda$ is the wavelength of light used for the exposure.

The first pattern may be provided by one of a phase shift mask and a mask manufactured by a dual-beam interference process.

The second pattern exposure may use a mask having a pattern of a shape similar to the desired pattern.

The coherence factor $\sigma_2$ for the second pattern may be set to a largest value obtainable with an exposure apparatus.

Just before the first pattern exposure and the second pattern exposure, an optimum numerical aperture NA may be set by changing an aperture diameter of a circular aperture at a pupil position of the projection optical system.

Just before the first pattern exposure and the second pattern exposure, one of an optical system of the projection optical system and a stop at a pupil position thereof may be moved to set an optimum coherence factor $\sigma_1$ or $\sigma_2$.

In accordance with another aspect of the present invention, there is provided an exposure apparatus having an exposure mode for performing an exposure method as recited above.

In accordance with a further aspect of the present invention, there is provided a device manufacturing method, comprising the steps of: exposing a wafer to a pattern of a reticle by use of an exposure method as recited above, or by use of an exposure apparatus as recited above; and developing the exposed wafer.

In accordance with a yet further aspect of the present invention, there is provided an exposure method for performing an exposure of a resist in relation to a desired pattern by use of a projection optical system, said method comprising: a first step for applying a first exposure amount distribution on the basis of a dual-beam interference exposure process; and a second step for applying a second exposure amount distribution on the basis of an exposure process using a mask having a pattern being analogous to the desired pattern, said second exposure amount distribution including a first portion of a small exposure amount not being zero and a second portion of a large exposure amount; wherein an exposure process for a portion of the desired pattern is performed on the basis of superposition of a portion of the first exposure amount distribution and the first portion of the second exposure amount distribution, while an exposure process for the remaining portion of the desired pattern is performed on the basis of the second portion of the second exposure amount distribution as superposed with another portion of the first exposure amount distribution; wherein the numerical aperture of the projection optical system in the second step is made smaller than that of the projection optical system in the first step.

In accordance with a still further aspect of the present invention, there is provided an exposure method for performing an exposure of a resist in relation to a desired pattern by use of a projection optical system, said method comprising; a first step for applying a first exposure amount distribution having an exposure amount not greater than an exposure threshold value of the resist, on the basis of a dual-beam interference exposure process using a first mask having at least one of a phase shifter and a light blocking portion; and a second step for applying a second exposure amount distribution on the basis of an exposure process using a second mask having a pattern being analogous to the desired pattern, said second exposure amount distribution including a first portion of an exposure amount not being zero but being not greater than the exposure threshold value, and a second portion of an exposure amount not less than the exposure threshold value; wherein an exposure process for a portion of the desired pattern is performed on the basis of superposition of a portion of the first exposure amount distribution and the first portion of the second exposure amount distribution, while an exposure process for the remaining portion of the desired pattern is performed on the basis of the second portion of the second exposure amount distribution as superposed with another portion of the first exposure amount distribution; wherein the numerical aperture of the projection optical system in the second step is made smaller than that of projection optical system in the first step.

In accordance with a yet further aspect of the present invention, there is provided an exposure method for performing an exposure of a resist in relation to a desired pattern by use of a projection optical system, said method comprising; a first step for applying a first exposure amount distribution on the basis of a periodic pattern exposure process; and a second step for applying a second exposure amount distribution on the basis of an exposure process using a mask having a pattern being analogous to the desired pattern, said second exposure amount distribution including a first portion of a small exposure amount not being zero and a second portion of a large exposure amount; wherein an exposure process for a portion of the desired pattern is performed on the basis of superposition of a portion of the first exposure amount distribution and the first portion of the second exposure amount distribution, while an exposure process for the remaining portion of the desired pattern is performed on the basis of the second portion of the second exposure amount distribution as superposed with another portion of the first exposure amount distribution; wherein the numerical aperture of the projection optical system in the second step is made smaller than that of the projection optical system in the first step.

In accordance with a still further aspect of the present invention, there is provided an exposure method for performing an exposure of a resist in relation to a desired pattern by use of a projection optical system, said method comprising: a first step for applying a first exposure amount distribution having an exposure amount not greater than an exposure threshold value of the resist, on the basis of a periodic pattern exposure process using a first mask having at least one of a phase shifter and a light blocking portion; and a second step for applying a second exposure amount distribution on the basis of an exposure process using a second mask having a pattern being analogous to the desired pattern, said second exposure amount distribution including a first portion of an exposure amount not being zero but being not greater than the exposure threshold value, and a second portion of an exposure amount not less than the exposure threshold value; wherein an exposure process for a portion of the desired pattern is performed on the basis of superposition of a portion of the first exposure amount distribution and the first portion of the second exposure amount distribution, while an exposure process for the remaining portion of the desired pattern is performed on the basis of the second portion of the second exposure amount distribution as superposed with another portion of the first exposure amount distribution; wherein the numerical aperture of the projection optical system in the second step is made smaller than that of the projection optical system in the first step.

In these aspects of the present invention, the exposure process may be performed in accordance with one of a first procedure in which the second step is carried out after the first step, a second procedure in which the first step is carried out after the second step, and a third procedure in which the first and second steps are carried out simultaneously.

In accordance with a further aspect of the present invention, there is provided an exposure apparatus having an exposure mode for executing an exposure method as recited above.

In accordance with a yet further aspect of the present invention, there is provided a device manufacturing method, comprising the steps of; exposing a wafer to a device pattern by use of an exposure apparatus as recited above; and developing the exposed wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A, 1B and 1C show exposure amount distributions in each exposure step, for explaining a dual exposure process, wherein FIG. 1A shows an exposure amount distribution of periodic pattern exposure, FIG. 1B shows an exposure amount distribution of a standard multiple-value exposure, and FIG. 1C shows a distribution corresponding to the sum of the exposure amounts in the dual exposure.

FIGS. 2A, 2B and 2C show a pattern and a mask for producing exposure amount distributions shown in FIGS. 1A–1C, wherein FIG. 2A shows a pattern and a mask for producing a repetition pattern only in a one-dimensional direction in which a high resolution is required, and FIGS. 2B and 2C show a gate pattern.

DESCRIPTION OF THE PREFERRFD EMBODIMENTS

In a first embodiment of the present invention, the depth for a pattern of a size near the resolution can be enlarged with the standard exposure, such that the depth for a combined image can be enlarged as much as possible. To this end, from a pattern to be resolved and the required depth, the light exit side numerical aperture (NA) of the projection optical system for the periodic pattern exposure and the coherence factor σ ("light exit side numerical aperture of the illumination optical system" divided by "light entrance side numerical aperture of the projection optical system") are determined. Also, in order to enlarge the depth of the combined image as much as possible, the numerical aperture (NA) for the standard exposure and the coherence factor are optimized. By doing it, the depth can be enlarged significantly without degrading the shape of reproducibility. Further, the two-dimensional shape is not degraded by this depth enlargement, and the shape reproducibility is good.

The first embodiment of the present invention will be described below in more detail.

The numerical aperture NA1 of the projection optical system for the periodic pattern exposure is determined by the following equation, in accordance with the exposure wavelength λ and the linewidth R of a fine pattern to be resolved:

$$NA1 = k_1(\lambda/R) \quad (k_1 >= 0.25)$$

Particularly, when the linewidth of the fine pattern is the smallest size of a limit resolution which can be resolved by currently available projection exposure apparatuses, the numerical aperture NA1 for the periodic pattern exposure (i.e., the light exit side NA of the projection optical system) becomes equal to the largest NA of the projection exposure apparatus used there. Further, the coherence factor σ (sigma) for the periodic pattern exposure is determined in accordance with the depth required for the process.

Next, the numerical aperture NA2 of the projection optical system for the standard exposure may be a numerical aperture NA with which the depth becomes largest, at the linewidth of a pattern in a portion, of the pattern to be resolved, which is not to be superposed with the periodic pattern, namely, the linewidth twice or three times larger than the finest pattern. Generally, if the NA is made smaller than an ordinary NA of the exposure apparatus, in other words, if the NA is restricted, a largest depth of focus is obtainable. As regards the coherence factor for the standard exposure, it may be a largest σ attainable in the exposure apparatus.

Here, the depth of focus for the standard exposure and for the periodic pattern exposure is determined by the coherence factor σ and the NA of the projection optical system, and an example of a combination of the coherence factor σ and the NA of the projection optical system will be described with reference to resolution of a gate pattern shown in FIG. 3.

Figure 3:
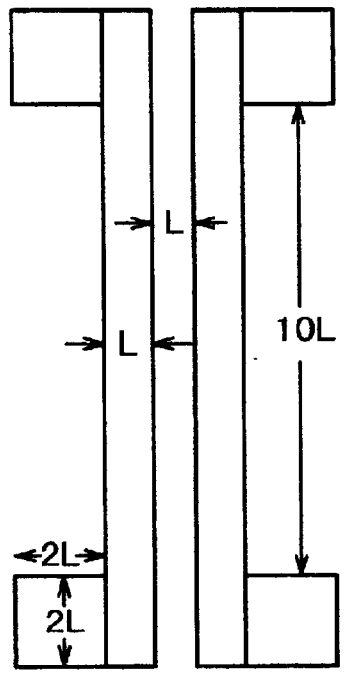
FIG. 3 is an enlarged view of a gate pattern.

Here, the pattern to be resolved is a light blocking type gate pattern shown in FIG. 3, and having a smallest linewidth L and including two thin lines of a pitch 2L.

A pattern for the periodic pattern exposure in the multiple exposure process may be such as shown in FIG. 2A wherein it has a smallest linewidth L and a period of a pitch 2L, and the periodic pattern is to be superposed with the portion of the gate pattern having the smallest linewidth.

A pattern for the standard (multiple-value) exposure, when the pattern is a light blocking type, may be formed by a mask such as shown in FIG. 2C. In FIG. 2C, the black-painted portion represents the light blocking portion, while the blank (white) portion represents the light transmitting portion. In this case, the gate pattern is defined by the light blocking portion.

Figure 4A:
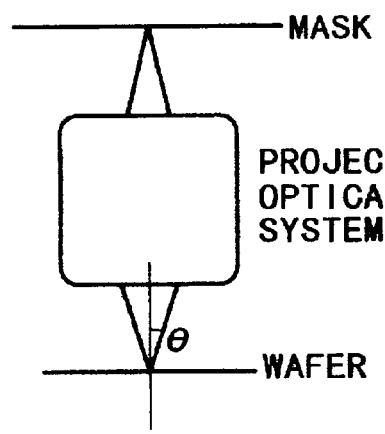
FIGS. 4A and 4B are schematic views, respectively, for explaining a state in which light emitted from a mask is imaged upon a wafer surface, when a resist is applied, through a projection optical system.
Figure 4B:
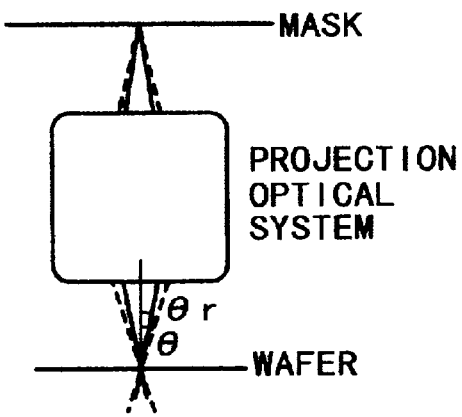

As shown in FIG. 4, the light emitted from the mask is imaged by the projection optical system on the surface of a wafer to which a resist is applied. The light incident on the mask is provided by an illumination optical system, not shown.

Figure 33:
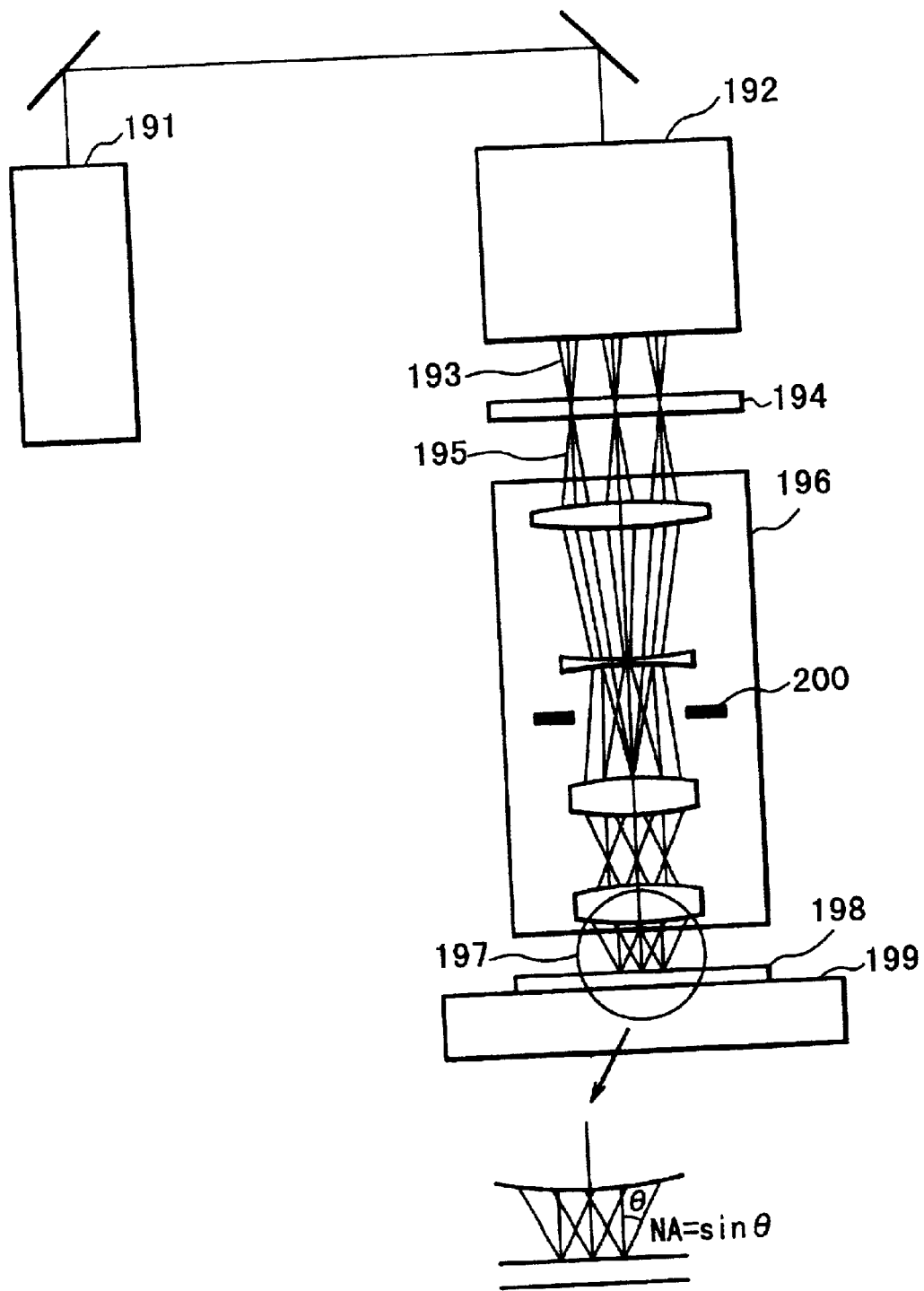
FIG. 33 is a schematic view of a general structure of a protection exposure apparatus.

An exposure apparatus having such a mask illumination optical system and a projection optical system for projecting the mask onto the wafer may be such as shown in FIG. 33, for example. The periodic pattern exposure process can be performed by using such an exposure apparatus. Here, an optimum value of the coherence factor σ (sigma) determined in accordance with the NA of the projection optical system and the NA of the illumination optical system, for the periodic pattern exposure, is detected.

First, as regards NA1, which is the numerical aperture of the projection optical system for the periodic pattern exposure, it can be determined automatically once, from equation (1) above, and the linewidth of a fine pattern to be resolved as determined.

$$NA = k_1(\lambda/R)$$

Theoretically, $k_1$ may be 0.25 or more. Since, however, completely coherent illumination is not effected in a projection exposure apparatus, usually, $k_1 \geq$ about 0.3.

When the gate pattern has a smallest linewidth L=0.12 micron, for example, and if a KrF excimer stepper having a wavelength of 248 nm (largest NA of the projection optical system is 0.6), which is a currently available projection exposure apparatus, is used, it follows from equation (1) that $k_1$=0.29. Therefore, a periodic pattern of a pitch 2L can be resolved. In consideration of the above, the wafer side (light exit side) NA of the projection optical system for the periodic pattern exposure may be set equal to the largest NA=0.6 of this optical system).

Next, as regards the coherence factor σ (sigma) for the periodic pattern exposure, it may be determined in accordance with the depth required for the process.

Figure 7:
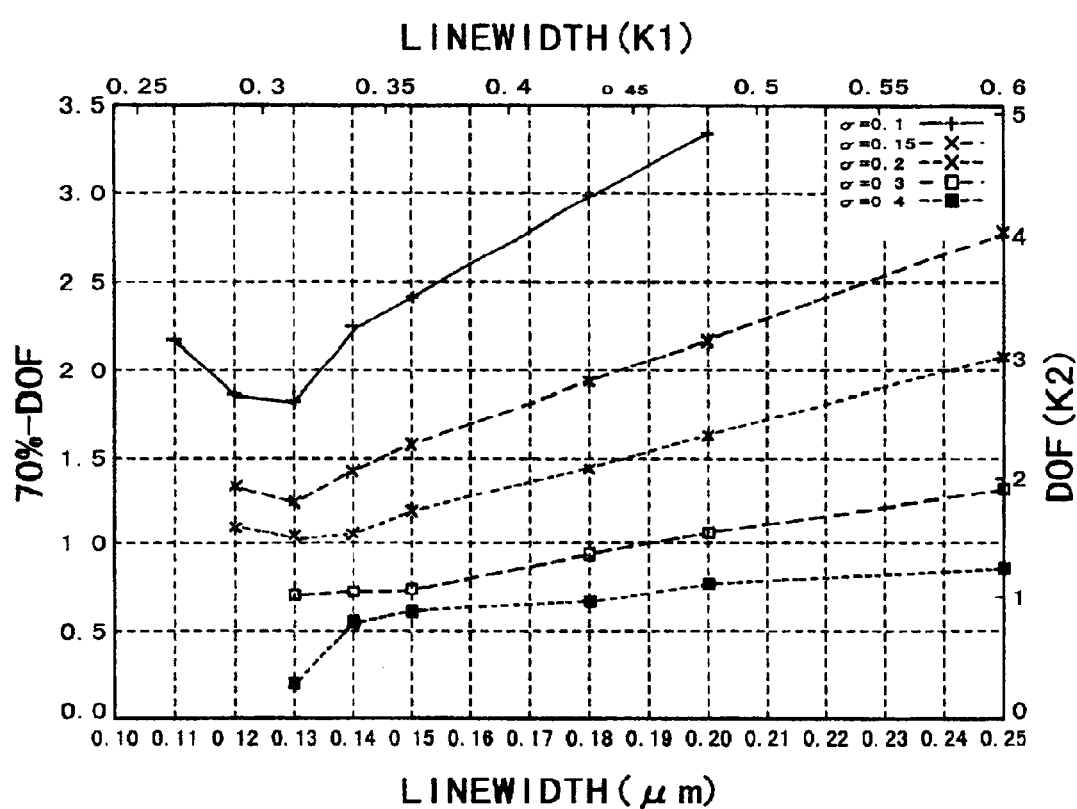
FIG. 7 is a graph for explaining the relation between the illumination condition of the periodic pattern and the depth of focus.

FIG. 7 illustrates the relation between the coherence factor σ and the depth for various linewidths. In FIG. 7, the contrast at various linewidths is measured while changing the value of the coherence factor σ. Then, only with respect to the contrast of 70% or more, the depth of focus is detected. The axis of abscissa denotes the linewidth, and the axis of ordinate denotes the depth. It is seen that, in order to obtain a value of $k_1$=1.0 or more with a linewidth from $k_1$=0.3 to $k_1$0.4, sigma (σ) should not be greater than 0.3. Particularly, in this case, for a pattern of a linewidth of 0.12 micron, if the required depth is 0.5 micron, sigma (σ) should be not less than 0.2.

In the manner described above, the exposure condition for the periodic pattern exposure, that is, NA and illuminations, can be determined. Subsequently, the exposure condition for the standard exposure, i.e., $NA_r$ and $\sigma_r$, will be determined.

The standard exposure pattern, namely, the gate pattern (FIG. 3), includes two thin lines of a linewidth L which are to be superposed in parallel to the periodic pattern, and lines of a linewidth 2L extending orthogonal to the two thin lines are not superposed with the periodic pattern.

Thus, the lines of a linewidth 2L should be resolved only by the standard exposure. The depth for resolving the lines of linewidth 2L is thus determined by the exposure condition for the standard exposure. Therefore, the exposure condition for resolving the linewidth 2L with which the defocus range becomes largest does not always correspond to the optimum exposure condition for the periodic pattern exposure. Namely, the exposure condition for the standard exposure should be determined so that the defocus range with which the linewidth 2L can be resolved becomes largest.

Figure 8A:
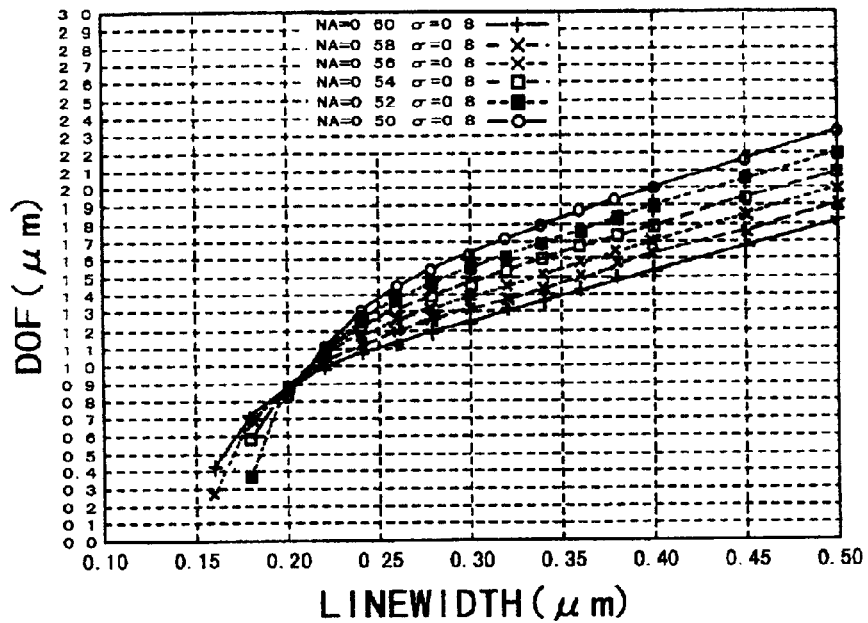
FIGS. 8A and 8B are graphs, respectively, for explaining the relation between the NA of the standard exposure and the depth of focus.
Figure 8B:
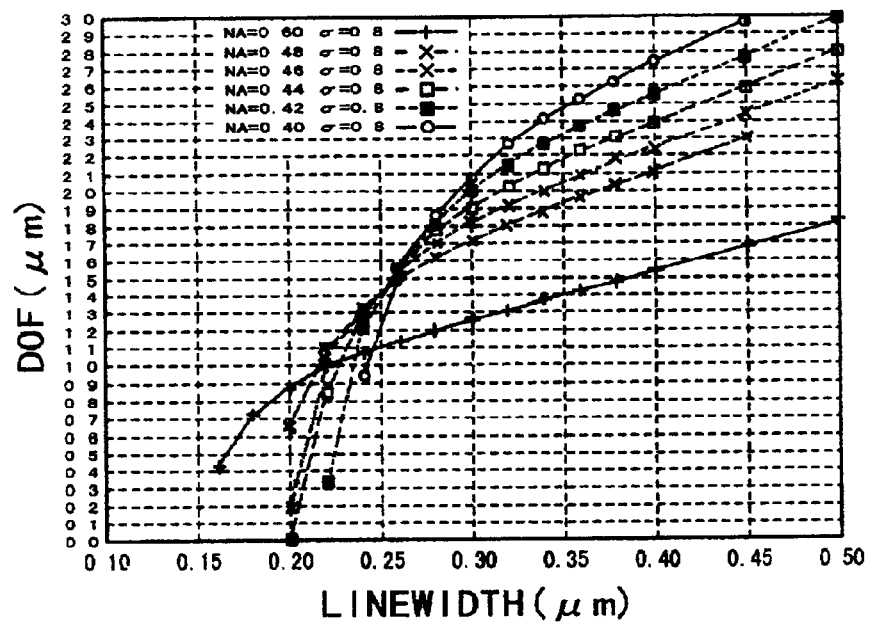

FIGS. 8A and 8B show the results that the depth for various linewidths is enlarged by changing the wafer side NA of the projection optical system for the standard exposure. The pattern used was a line-and-space pattern of light blocking type, having two bars. The depth was at the defocus width with which a contrast of 40% or more was obtainable. As regards NA, it was not greater than the largest NA of a projection optical system of a KrF excimer laser, as described hereinbefore. The wavelength was 248 nm, and σ was 0.8. The projection magnification of the projection optical system was 1/5.

In FIGS. 8A and 8B, while changing the NA, contrast at various linewidths was measured and, then, the depth of focus with a contrast not less than 40% was detected. The axis of abscissa denotes the linewidth, and the axis of ordinate denotes the depth of focus. It is seen from the drawings that, as the NA becomes smaller, the depth at a small linewidth becomes unattainable. In place, the depth of focus for a thick line becomes large. In this case, the value of NA=0.50 with which a large depth of focus is obtainable at a pattern linewidth 2L=0.24, which does not depend upon the periodic pattern of the gate pattern, may be set as an optimum value for the numerical aperture of the projection optical system in the standard exposure.

Further, as regards the coherence factor σ for the standard exposure, it is known that a better two-dimensional shape of a pattern resolved is obtainable with a larger σ. Thus, the coherence factor may be set to a largest σ attainable in the exposure apparatus used. When the NA of the projection optical system of this exposure apparatus is changed from 0.60 to the optimum value 0.50 described above, the mask side NA of the projection optical system is 0.1. If the mask side NA of the illumination optical system is 0.096, then the largest σ is 0.096/0.1 and, therefore, $\sigma_r$=0.96 is determined.

In consideration of the above, the NA of the projection optical system for the standard exposure is set to be the NA with which the depth of focus becomes largest in relation to the linewidth of a pattern in a portion, of the pattern to be resolved, which is not superposed with the periodic pattern, namely, in relation to the pattern of a linewidth two or three times larger than the finest pattern. Generally, if it is made smaller than the NA of a projection optical system of currently available exposure apparatuses, namely, the NA is restricted (made smaller), a largest depth of focus is obtainable.

Further, the coherence factor σ for the standard exposure should be a largest σ attainable in the exposure apparatus used, in order to obtain a better two-dimensional shape of the pattern resolved. Also, in order to extend the depth, a known ring-like illumination method may be used for the mask or reticle illumination, in which method the intensity distribution of an effective light source provided by the illumination light becomes larger at the peripheral portion than at the central portion of the illumination light.

Combining this with the result of the NA of the projection optical system for the periodic pattern exposure, the NA of the projection optical system for the standard exposure may be made smaller than the NA of the projection optical system for the periodic pattern exposure. On that occasion, a largest depth is obtainable with a linewidth not less than the resolution, corresponding to the linewidth not dependent upon the periodic pattern.

However, as a result of investigations made in relation to various patterns, it has been found that, if the NA of the projection optical system for the standard exposure is made equal to 70% or less of the NA of the projection optical system for the periodic pattern exposure, the two-dimensional shape of the pattern in the standard exposure is degraded. Thus, the NA of the projection optical system for the standard exposure should preferably be made smaller than, specifically, be kept not less than 70% of the NA of the projection optical system for the periodic pattern exposure.

For resolution of a gate pattern of a smallest linewidth of 0.12 micron, a multiple exposure process may be performed under the conditions such as described above: Namely, for the periodic pattern exposure, a wafer may be exposed by use of an exposure apparatus (#1) having a projection optical system with an NA=0.60 (largest NA). For the standard exposure, the same wafer may be exposed by use of another exposure apparatus (#2) having a projection optical system with an NA=0.50. Generally, one and the same exposure apparatus may be used as the exposure apparatuses #1 and #2, but separate apparatuses may be used. As regards the coherency of σ as an illumination condition, the periodic pattern exposure may be performed with a smaller σ, and the standard exposure may be performed with a larger σ, larger than that in the periodic pattern exposure, and preferably with a largest σ of the apparatus. Then, the gate pattern can be resolved at the largest depth within the required depth.

The numerical aperture NA of the projection optical system can be changed, in an exposure apparatus such as shown in FIG. 33, by changing the aperture diameter of a stop 200, provided at the pupil position and having a circular opening, for example. This enables setting an optimum NA for the periodic pattern exposure and the standard exposure, respectively. In response, the aperture diameter or the aperture shape of an aperture stop of the illumination optical system 192 may be changed to adjust the numerical aperture NA of the optical system 192, to set optimum sigmas for the periodic pattern exposure and the standard exposure, respectively.

For example, the periodic pattern exposure may be performed with a largest NA of the projection optical system of the exposure apparatus, while, only for the standard exposure, the stop 200 may be moved to restrict the NA to $NA_r=0.50$. On the other hand, the NA of the illumination optical system may be restricted to a smaller σ only for the periodic pattern exposure, while a largest NA (largest σ) of the illumination optical system may be set for the standard exposure.

Figure 5A:
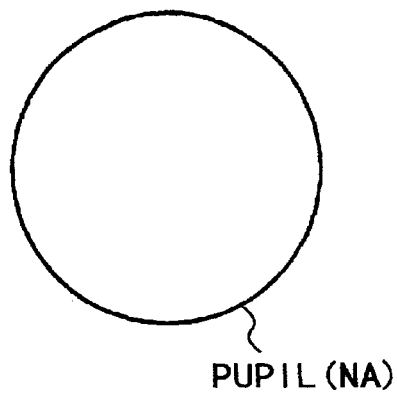
FIGS. 5A and 5B are schematic views, respectively, for explaining the size of a pupil during the standard exposure process and the periodic pattern exposure process in the exposure apparatus.
Figure 5B:
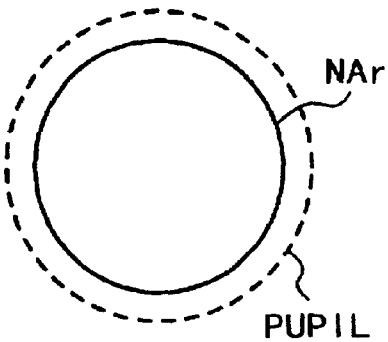
Figure 6A:
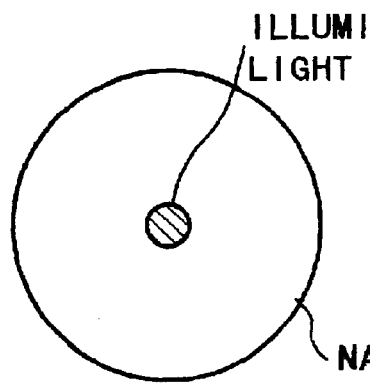
FIGS. 6A and 6B are schematic views, respectively, for explaining a largest sigma of an illumination condition, for the standard exposure process and the periodic pattern exposure process.
Figure 6B:
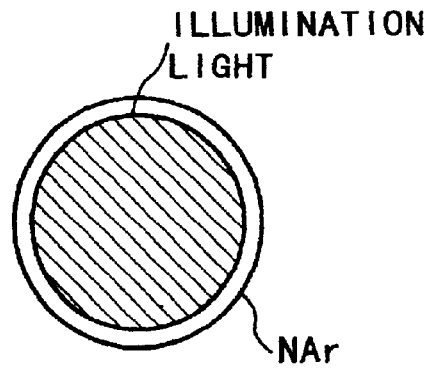

On that occasion, at the pupil plane corresponding to the position of the stop 200 of the projection optical system, as shown in FIG. 5, the pupil is not restricted in the periodic pattern exposure whereas it is restricted in the standard exposure, to make the NA smaller. In FIGS. 5A and 5B, the range of light incidence upon the pupil plane is depicted. Since the pupil is restricted in the standard exposure, the diameter of the light incidence range is smaller. Separately from this, when the illumination light on the pupil plane is depicted by hatching when zero-th order light is incident, the results are such as shown in FIGS. 6A and 6B. For the periodic pattern exposure, the NA of the illumination optical system is made smaller to make the illumination condition σ smaller. For the standard exposure, a largest NA of the illumination system and a largest σ are taken. FIGS. 6A and 6B show the incidence range of a zero-th order light of the illumination light upon the pupil plane, by hatching. For the periodic pattern exposure, the NA of the illumination optical system is made smaller, to make smaller the diameter of the light incidence range. For the standard exposure, the pupil of the projection optical system is restricted, to make the diameter of the light incidence range smaller. Therefore, the range for the largest σ, that is, the incidence range of the illumination light is apparently made larger than the largest σ before the NA of the projection optical system is restricted.

A second embodiment of the present invention provides an exposure method, an exposure apparatus and a device manufacturing method, by which, even in a small $k_1$ process where the $k_1$ factor is as small as 0.3 to 0.4, or below 0.5, a good image performance of an ordinary $k_1=0.5$ or more is obtainable and by which aberration is less reflected to the image performance. The exposure condition, NA, and σ for respective standard exposure and periodic pattern exposure are optimized, by which an image of $k_1=0.3$ to 0.4 can be produced with a good shape reproducibility and a practical depth. This is based on the finding as follows.

Figure 13:
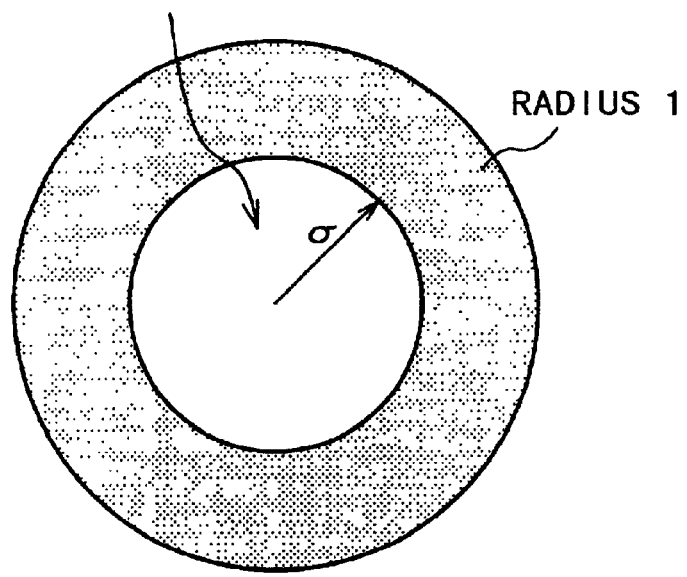
FIG. 13 is an enlarged view of an effective light source, for explaining embodiments and examples of the present invention.

In the standard exposure, as the coherence factor is made larger to strengthen the incoherency of illumination, namely, the size of the effective light source shown in FIG. 13 is made larger, degradation due to the aberration becomes smaller. This is because the illumination light is incident in various angles such that the effect of the aberration to the image is averaged. However, with an ordinary binary mask, a contrast is not obtainable with a linewidth of $k_1=0.5$ or less, and it cannot be resolved.

FIG. 13 shows an effective light source, and illustrates a distribution of illumination light upon a pupil plane. The black-painted portion represents the region for blocking the light, and the blank (white) portion depicts the portion where the light is transmitted. In order to obtain a sufficient contrast with a linewidth $k_1=0.5$ or less, a phase shift mask wherein juxtaposed phases are mutually inverted, may be used. On that occasion, the illumination light should have an effective light source of high coherency and a small σ.

If the sigma is made small by using a phase shift mask, a contrast is obtainable. However, with an arbitrary pattern other than a simple line-and-space pattern, the shape reproducibility is bad, and the image performance is easily degraded by the aberration.

Figure 17:
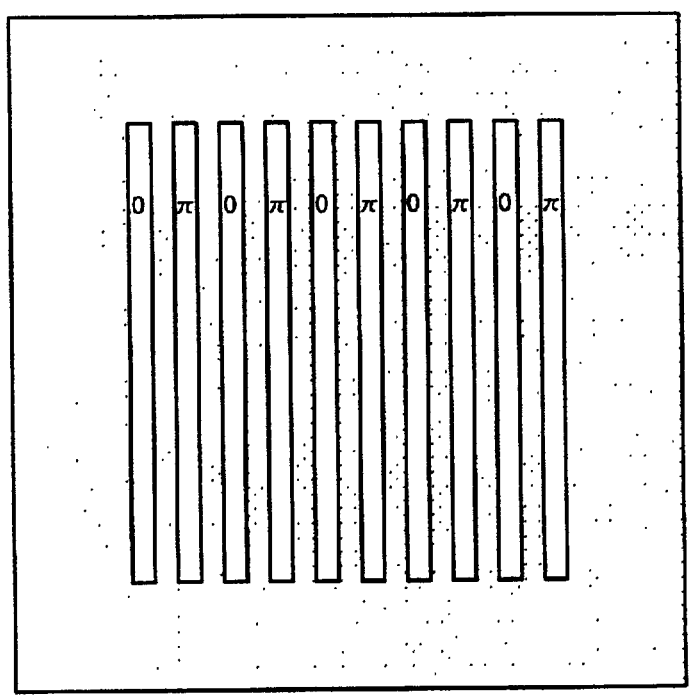
FIG. 17 is an enlarged view of a periodic pattern of a phase shift mask, for explaining embodiments and examples of the present invention.
Figure 22:
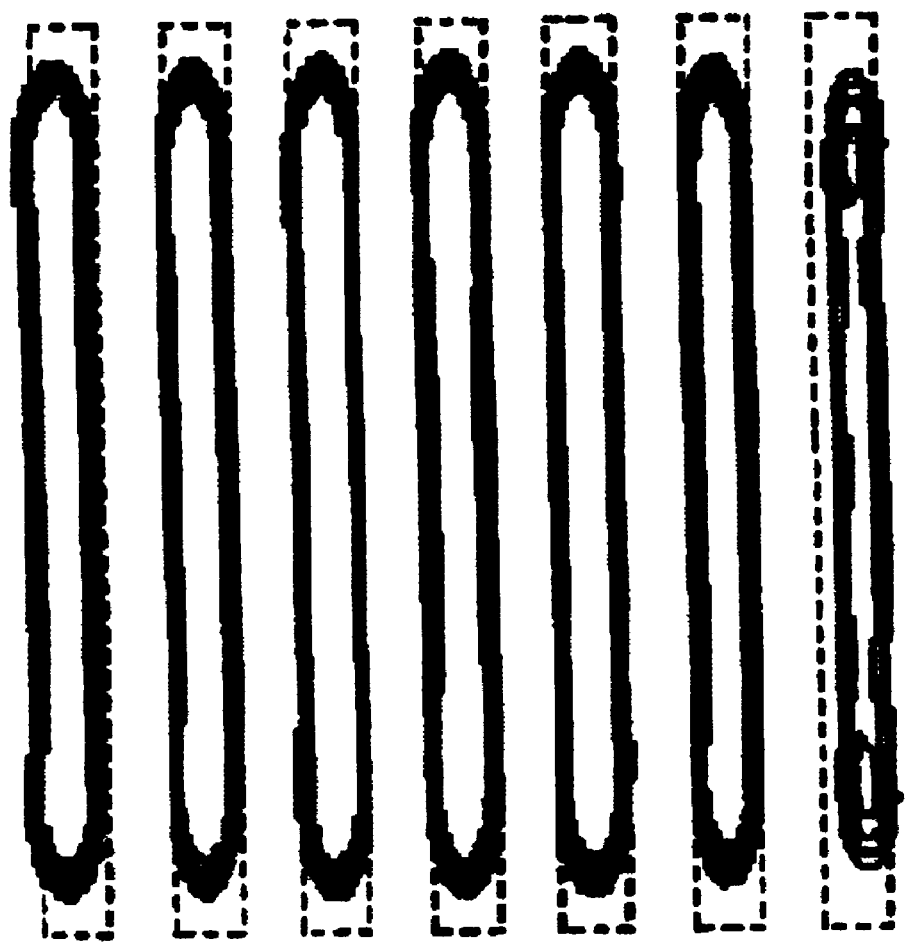
FIG. 22 is an enlarged view of an image formed by use of a phase shift mask under an illumination condition sigma=0.3, for explaining embodiments and examples of the present invention.

However, if a line-and-space pattern (FIG. 17) of a phase shift mask in which the line and the space has the same size $k_1=0.3$ is exposed under a coherence factor $\sigma=0.3$, the result is such as shown in FIG. 22. In FIG. 17, the gray (hatching) portion represents the portion for blocking the light, while the blank (white) portion depicts the portion for transmitting the light. The phases of adjacent patterns are mutually inverted. It is seen from FIG. 22 that, in the portion other than the opposite ends, namely, in the five line patterns at the center, the linewidth is uniform and the pattern shift is very small.

Figure 14:
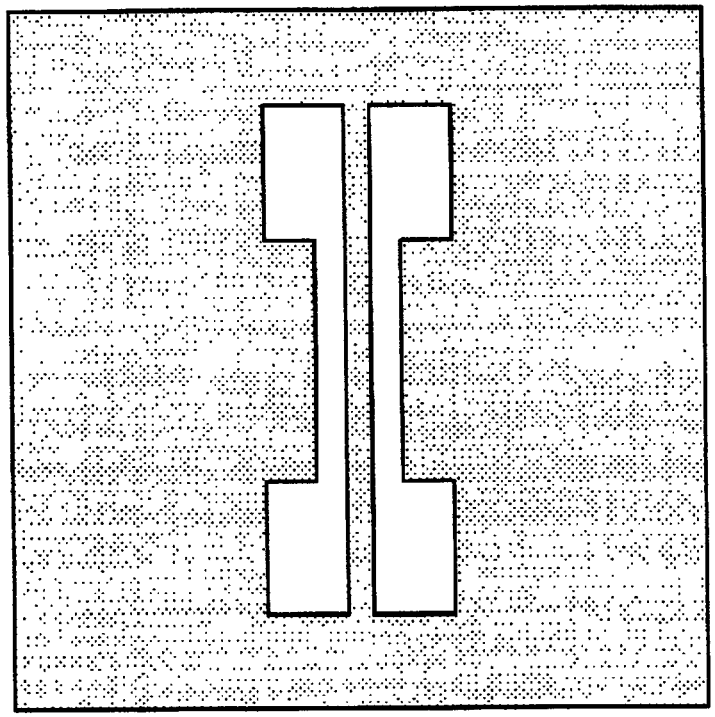
FIG. 14 is an enlarged view of a light transmission type pattern having a single phase, for explaining embodiments and examples of the present invention.
Figure 15:
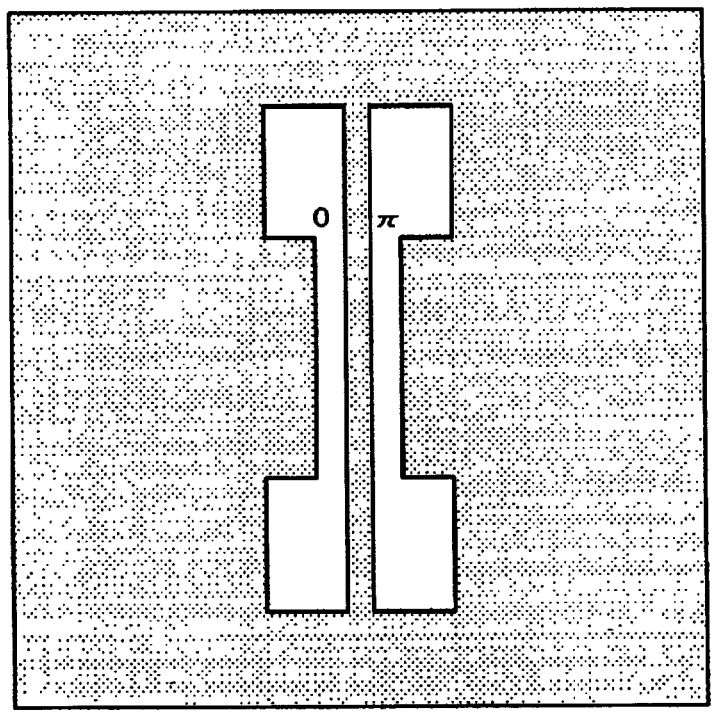
FIG. 15 is an enlarged view of a phase shift mask having two different phases, for explaining embodiments and examples of the present invention.

In consideration of this, a desired pattern (FIG. 12) may be printed by projection exposure through incoherent illumination and by use of a binary mask pattern (FIG. 14), while a periodic pattern (FIG. 17) of a phase shift mask may be superposed thereupon, so that the images are combined (dual exposure). With this procedure, an image in which the shape is not easily degraded even if there is aberration and if a complicated pattern of a binary mask is used, as well as an image in which the contrast at the central portion of the line-and-space pattern of the phase shift mask is high and the image performance is not degraded, can be superposed on upon another. As a result, an image of high contrast and being not easily influenced by the aberration can be formed. As regards the pattern of the phase shift mask, it may be a periodic pattern including a fine portion of the desired pattern and having periods, on the opposite sides, larger than that of the desired pattern, by one period or more, so that it is less influenced by the aberration.

The procedure for producing a periodic pattern in the second embodiment will be explained with reference to FIG. 32.

Figure 12:
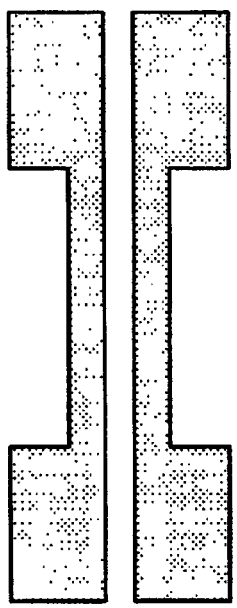
FIG. 12 is an enlarged view of an evaluation pattern, for explaining embodiments and examples of the present invention.
Figure 32:
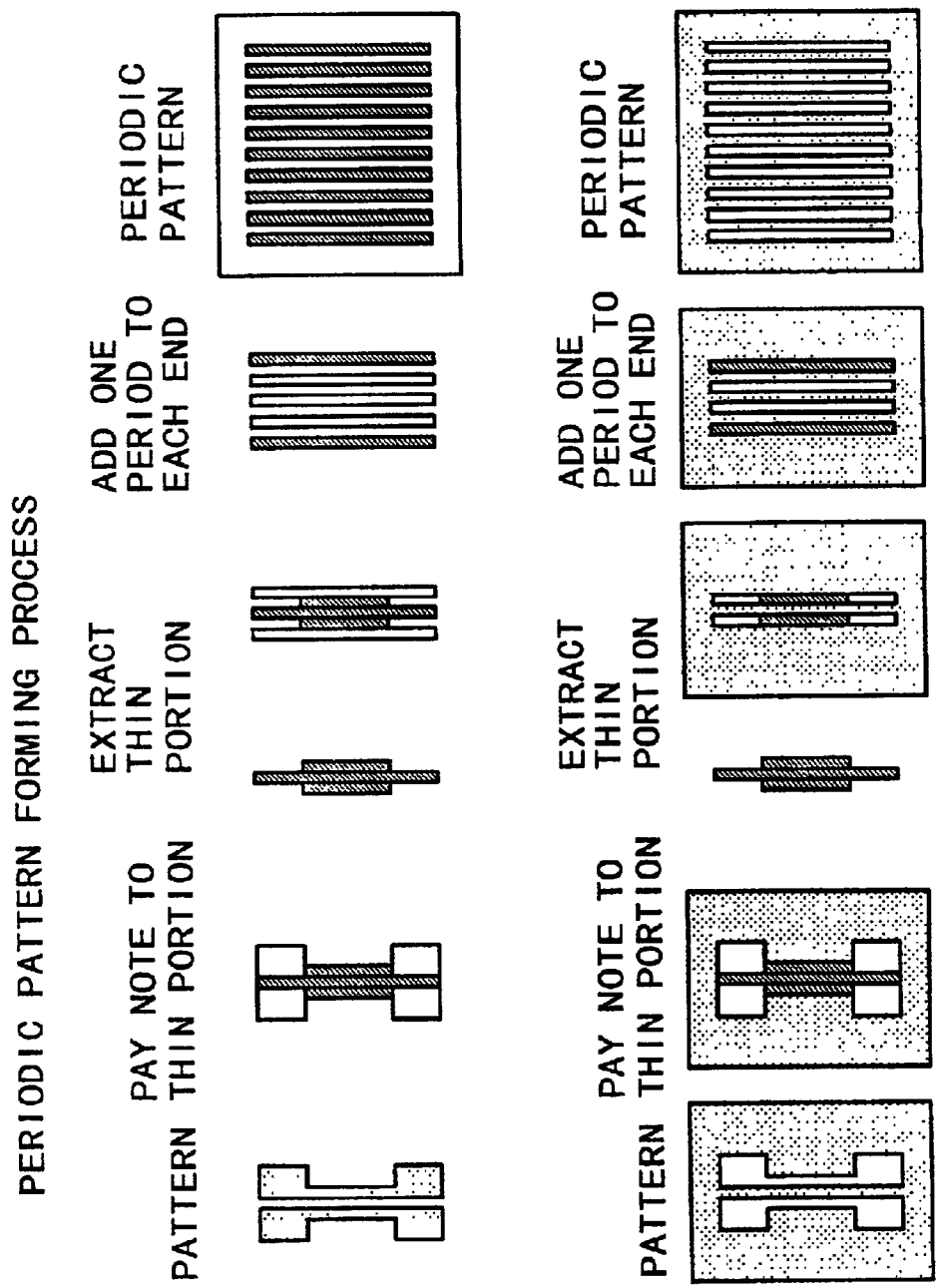
FIG. 32 is a schematic view for explaining the procedure for forming a periodic pattern in the second embodiment of the present invention.

In FIG. 32, there is a desired pattern (a) which may be the pattern shown in FIG. 12. The upper row concerns a light blocking type pattern, while the lower row concerns a light transmissive type pattern. In part (b), a particular note has been paid to a fine portion of the pattern, and the fine portion is illustrated by hatching. Note should be made to not only the pattern (line) but also to the space between the patterns.

In part (c), the left-hand side thereof, only the fine portion is extracted. Then, as shown in the right-hand side, the pattern is extended in the longitudinal direction. The hatched portion depicts the fine portion. Here, it may be extended more than the fine portion of the desired pattern. In the light blocking pattern shown in the upper row, when light transmissive patterns are provided at the opposite sides so that the two linear patterns (light blocking portion) define a light blocking portion between patterns, the region between the two linear patterns can be a transmissive pattern.

In part (d), the fine portion is extracted, and patterns of the same size each being equal to one period are added to the opposite ends of the pattern having been extended in the longitudinal direction, as depicted by the hatching. Part (e) shows a periodic pattern thus formed, and the number of periods is made large. In the upper row, the number of periods of five or more is sufficient, while in the lower row, the number of periods of four or more is sufficient.

Namely, the standard exposure based on incoherent illumination to a desired pattern of a binary mask as well as the periodic pattern exposure in which only a fine portion of the desired pattern, having a phase shift effect, is extracted and the number of periods is made larger, by one period more, of the fine portion, are performed in superposition. By this, an image of high contrast less affected by the aberration is produced.

Figure 19:
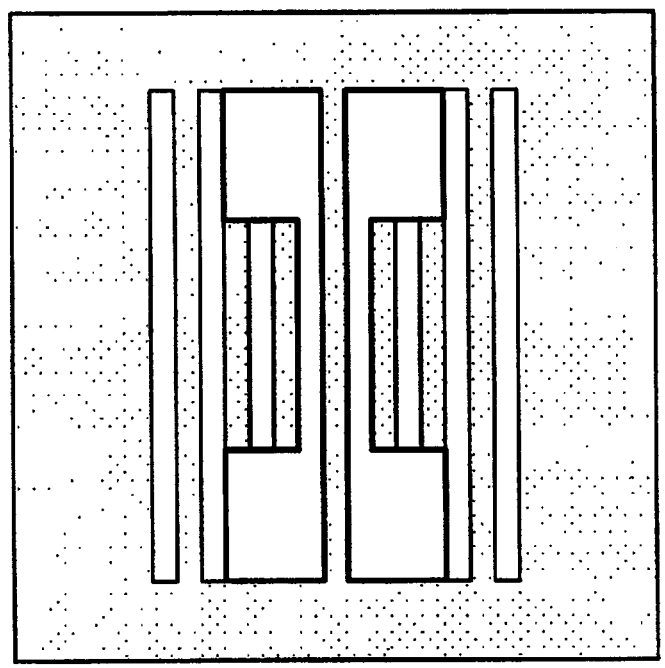
FIG. 19 is an enlarged view of another pattern obtainable by a multiple exposure process, for explaining embodiments and examples of the present invention.
Figure 20:
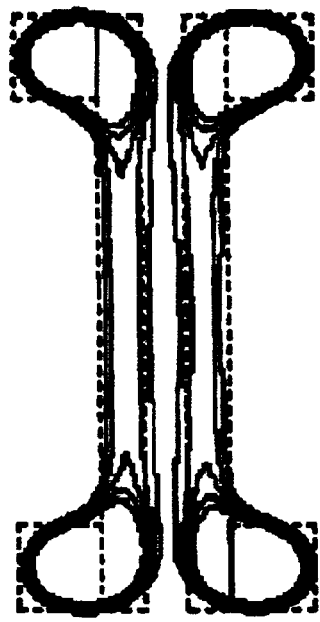
FIG. 20 is an enlarged view of an image formed by use of a binary mask, for explaining embodiments and examples of the present invention.
Figure 21:
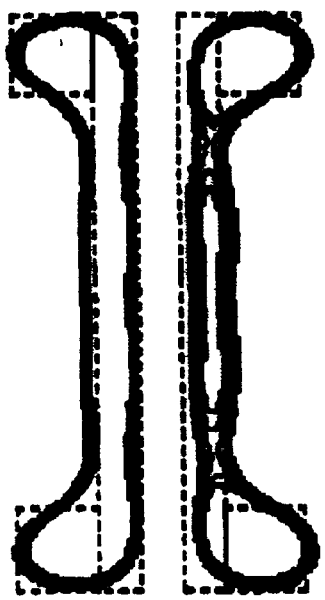
FIG. 21 is an enlarged view of an image formed by use of a phase shift mask, for explaining embodiments and examples of the present invention.

FIG. 19 shows an image obtainable by the image superposition as described above.

Figure 16:
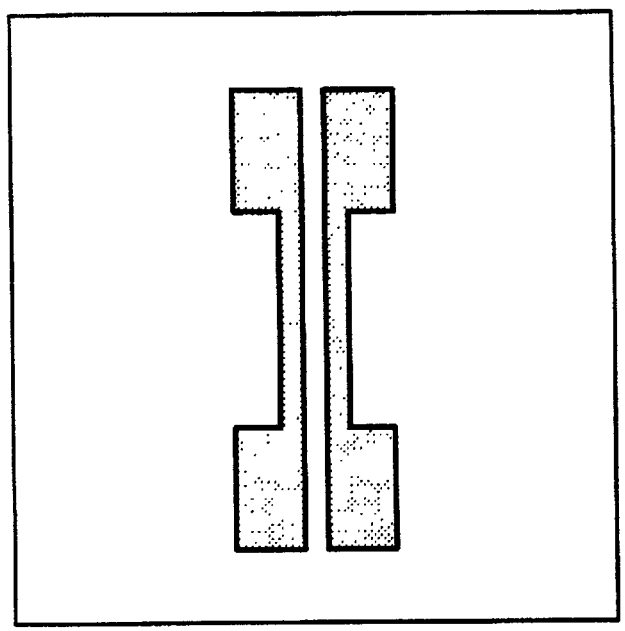
FIG. 16 is an enlarged view of a light blocking type mask pattern, for explaining embodiments and examples of the present invention.
Figure 18:
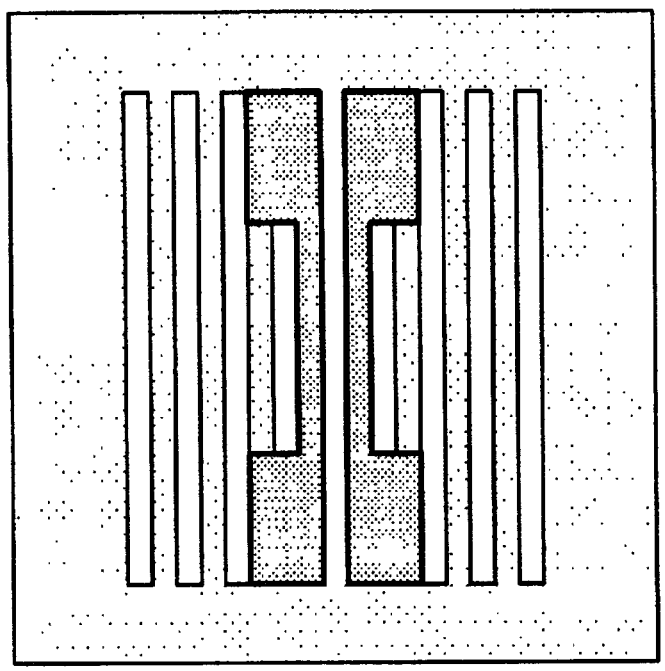
FIG. 18 is an enlarged view of a pattern obtainable by a multiple exposure process, for explaining embodiments and examples of the present invention.

If a desired pattern is a light blocking pattern in which, as shown in FIG. 16, the pattern blocks the light while the peripheral portion of the pattern transmits light, although it is known that such a pattern is more sensitive to aberration as compared with a light transmissive pattern, in order to obtain such a light blocking pattern, the periodic pattern may be shifted by a half pitch so that images are superposed one upon another as shown in FIG. 18.

Also, as an example of an exposure method for reducing the aberration in the multiple exposure process, in the present invention, the NA of the projection optical system is restricted (made smaller). For example, if there is a coma aberration of $c8=0.05\lambda$ in equation (5), since the radius of the pupil is standardized to 1, the amount of wavefront deviation at the pupil periphery ($r=1$) in the 90-degree direction becomes equal to $0.05\lambda$. However, at 80% or less of the pupil ($r \leq 0.8$), the largest value of the wavefront deviation becomes equal to $0.03\lambda$.

When the NA of the projection optical system is restricted, the largest value of the wavefront deviation due to the aberration in the term other than the spherical aberration, attributable to the Zernike's coefficient of equation (4), becomes smaller. If the focus is considered as one aberration, the aberration curve becomes slow and also the focus characteristic becomes slow. Therefore, as in the preceding embodiments, the depth is enlarged.

If the NA of the projection optical system is restricted, the image performance (contrast) is degraded, as seen from the Rayleigh's equation (equation (1)). In consideration of it, usually, near the limit resolution, the numerical aperture NA of the projection optical system is not made small. However, when the superposed exposures such as described above are to be carried out, even if the resolution performance of the binary mask is degraded slightly and the contrast is lowered, the resolution is assured by the composition with a high contrast image provided by the periodic pattern exposure. Thus, the NA of the projection optical system can be made smaller, in this embodiment.

Namely, in the standard exposure, a certain fine line is not resolved, to thereby prevent degradation of the image performance due to the aberration. This fine line can be then resolved by high contrast in the periodic pattern phase shift exposure. In this method, although the fine line portion in the standard exposure is not resolved, an image such as of a thick line corresponding to three fine lines (two lines and a gentle space therebetween) is formed. If this is combined with the periodic pattern, the intensity only at the two lines are raised, such that, as a result of a development process, only predetermined two lines of the pattern remain as an image.

If the NA of the projection optical system is restricted while the NA of the illumination optical system is not restricted, the coherence factor $\sigma$ (sigma) is relatively enlarged. This is because the coherence factor (sigma) corresponding to the radius of the effective light source on the pupil plane is determined in accordance with the following equation:

$$\sigma=\text{(light exit side NA of illumination optical system)/(light entrance side NA of projection optical system)} \quad (6)$$

In a case where the largest $\sigma$ ($\sigma\max$)=0.8, if only the NA of the projection optical system is restricted by 80%, from equation (6), it is seen that $\sigma\max=1.0$.

Therefore, the influence of aberration can be reduced by superposing the periodic pattern exposure and the standard exposure of a binary mask. However, by restricting the NA of the projection optical system for the standard exposure, the image performance such as focus characteristic, for example, can be improved much more. It should be noted however that, as compared with a case where the NA of the binary mask is not restricted, the contrast at the best focus is lowered if the coherence factor for illuminating the phase shift mask is the same.

In consideration of it, the NA of the projection optical system and the coherence factor for the periodic pattern exposure as well as the NA of the projection optical system and the coherence factor for the standard exposure should be determined in accordance with the contrast necessary for resolution of the resist.

Namely, the exposure condition for the periodic pattern exposure is determined in accordance with the linewidth R of the fine pattern and the wavelength λ, as follows:

$$NA = k_1(\lambda/R) \ (k_1 \geq 0.25)$$

Namely, $NA \geq 0.25(\lambda/R)$ is set.

Usually, the numerical aperture NA of the projection optical system which is the exposure condition is set to a largest NA of the projection optical system of the exposure apparatus used.

As regards the illumination condition of the coherence factor σ for the periodic pattern exposure, it should be set so that, in the fine linewidth $k_1$ is not greater than 0.4, a high contrast of 80% or more and a value $k_2$ as divided by $(\lambda/NA^2)$ is 0.5 or more. Namely, the illumination condition should be set to satisfy relations $k_1 \leq 0.4$ and $k_1 \geq 0.5$. When a phase shift mask is used, σ should preferably be set to 0.3 or less.

If the periodic pattern exposure attains a contrast of 80% or more, even if the contrast of a fine line in the standard exposure is zero, a composite image may obtain a contrast of 40% ore more. If a contrast of more than 40% is obtainable, a currently available resist can be resolved.

In the periodic pattern exposure, it is not always necessary to use a phase shift mask. A periodic pattern of a binary mask may be used and exposed in accordance with a dual beam interference exposure process based on oblique incidence illumination. As regards the illumination condition on that occasion, if both the linewidth and the space of the periodic pattern are equal to $k_1$ and the direction of the periods is in the X direction, the central position in the X direction of the effective light source on the pupil may be placed close to:

$$x = 1/(4k_1), x = -1(4k_1).$$

In order to satisfy the above condition, the radius from the central position may be not greater than 0.3 when the radius of the pupil is taken as 1.

The numerical aperture NA2 of the projection optical system when a binary mask of an ordinary pattern, other than a periodic pattern, is used, should be one which does not resolve the fine portion. It should be determined in accordance with the linewidth of a pattern portion being independent from the periodic pattern, that is, the pattern portion other than fine pattern to be resolved by the periodic pattern. If the size of a smallest linewidth portion of the fine pattern is R, in order to prevent resolution of R, it follows that:

$$NA2 \leq 0.4(\lambda/R).$$

If the linewidth of the pattern portion other than the fine pattern is 2R, for resolution of the same, it follows that:

$$NA2 \leq 0.5(\lambda/R2).$$

By applying this concept to various patterns, it has been found that the numerical aperture NA2 of the projection optical system for the standard exposure should preferably be 70% or more of the NA for the periodic pattern exposure, and it should be smaller than the latter. That is:

$$0.7NA \leq NA2 < NA$$

where NA is the exposure condition for the periodic pattern exposure, and NA2 is the exposure condition for the standard pattern.

As regards the coherence factor σ for the standard exposure, it should be made equal to a largest σ of the exposure apparatus used. The shape of the effective light source to be formed on the pupil plane of the projection optical system or illumination optical system is not limited to a circular shape. It may be a rectangular or ring-like shape, or a rectangular ring shape, for example.

The exposure method based on superposed exposures in these embodiments can be summarized as follows.

In a multiple exposure method for printing a pattern, including a fine portion, on a substrate by use of a projection exposure apparatus, the influence of the aberration of the exposure apparatus can be minimized and the image performance such as contrast or shape reproducibility can be improved. To this end, a dual exposure process including a periodic pattern exposure for the fine portion only, being based on relatively small σ illumination, and a standard exposure process based on relatively large σ illumination and not for solving the fine portion, may be performed. In this procedure, the numerical aperture NA of the projection optical system may be restricted in the latter exposure, than in the former exposure.

As regards the periodic pattern, only a fine portion of a pattern to be resolved may be extracted, and the fine portion may be extended continuously. Additionally, at the opposite sides of the fine portion, one period or more may be added to extend the period.

The periodic pattern exposure may be based on imaging the fine portion of a desired pattern to be resolved, by use of dual-beam interference.

The exposure condition for the periodic pattern exposure is that the numerical aperture of the projection optical system may be set to an NA which is larger than the NA obtainable by dividing the exposure wavelength λ by the length R of a shorter one of the line and the space of the fine pattern portion.

The NA of the projection optical system for the periodic pattern exposure may be a largest NA attainable in an exposure apparatus used.

The exposure condition for the periodic pattern exposure may be such that, for a fine linewidth in which $k_1$ obtainable by dividing R by $(\lambda/NA)$ and then by multiplying it by 0.25 is not greater than 0.4, a contrast of 80% or more is obtainable. Also, it may be such that $k_2$ obtainable by dividing the defocus amount d from the best focus by $(\lambda/NA^2)$ is not less than 0.5.

When a phase shift mask is used to perform the periodic pattern exposure, the coherence factor σ may be made not greater than 0.3.

The pattern for the standard exposure may have a shape similar to the pattern to be resolved.

The standard exposure may use imaging based on triple-beam interference, and the fine portion cannot be resolved thereby. The NA of the projection optical system for the standard exposure may be NA2, which is smaller than the NA obtainable by dividing the exposure wavelength λ by the length R of a shorter one of the line and the space of the fine portion and then multiplying it by 0.4.

The NA of the projection optical system for the standard exposure may be $NA_2$ which is larger than the NA obtainable by dividing the exposure wavelength λ by the linewidth R2 of a portion of the pattern to be resolved, other than the fine portion not to be resolved by the standard exposure but to be resolved by the periodic exposure, and then by multiplying it by 0.5.

The NA of the projection optical system for the standard exposure may be NA2 corresponding to 70% or more of the NA of the projection optical system for the periodic pattern exposure.

The coherence factor σ (sigma) for the standard exposure may be a largest σ attainable in an exposure apparatus used.

In a multiple exposure method for printing a fine pattern on a substrate to be exposed, by use of a projection exposure apparatus, the influence of the aberration of the exposure apparatus can be minimized and the image performance such as contrast of shape reproducibility can be improved. To this end, a dual exposure process including a periodic pattern exposure and a standard exposure process may be performed. The periodic pattern exposure may be carried out such that only a fine portion of the pattern to be resolved is extracted, and a mask having a periodic pattern which is larger, by one period or more, than it is used to perform the imaging of the mask pattern based on the dual beam interference. The standard exposure may use a mask of a shape similar to the pattern to be resolved, and it applies to an image a multiple-value intensity distribution on the basis of the imaging through triple-beam interference or dual-beam interference.

The exposure condition for the periodic pattern exposure may be determined in accordance with the linewidth R of the fine pattern and the exposure wavelength λ, as follows:

$$NA = k_1(\lambda/R) \ (k_1 \geq 0.25)$$

wherein NA may be a largest NA of the projection optical system of an exposure apparatus used.

The coherence factor σ for the periodic pattern exposure may be not greater than 0.4, and it may be determined in accordance with the required depth for the fine pattern linewidth. In a fine linewidth in which a normalized linewidth $k_1$ obtainable by dividing the linewidth by (λ/NA) is not greater than 0.4, in order that $k_2$ obtainable by dividing, by (λ/NA$^2$), the depth of focus for obtaining a contrast necessary for the resolution is 0.5 or more, sigma may be made not greater than 0.3.

In the standard exposure, the NA of the projection optical system may be determined in accordance with the pattern not dependent upon the periodic pattern exposure, that is, the linewidth of a pattern other than the fine pattern to be resolved by the periodic pattern exposure.

Next, specific examples of the present invention will be described.

EXAMPLE 1

Figure 10:
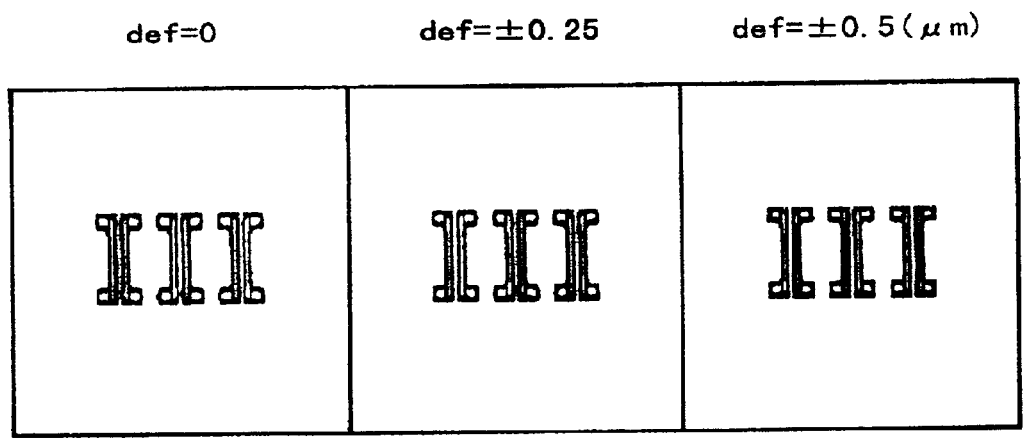
FIG. 10 is a schematic view of two-dimensional images resulting from a multiple exposure process including periodic pattern exposure and standard exposure, for a gate pattern shown in FIG. 3.

FIG. 10 shows two-dimensional images produced by a multiple exposure process in Example 1 of the present invention. The two-dimensional images shown in FIG. 10 are those having been formed by the multiple exposure process, including a periodic pattern exposure and a standard pattern exposure made to a gate pattern shown in FIG. 3.

Figure 9:
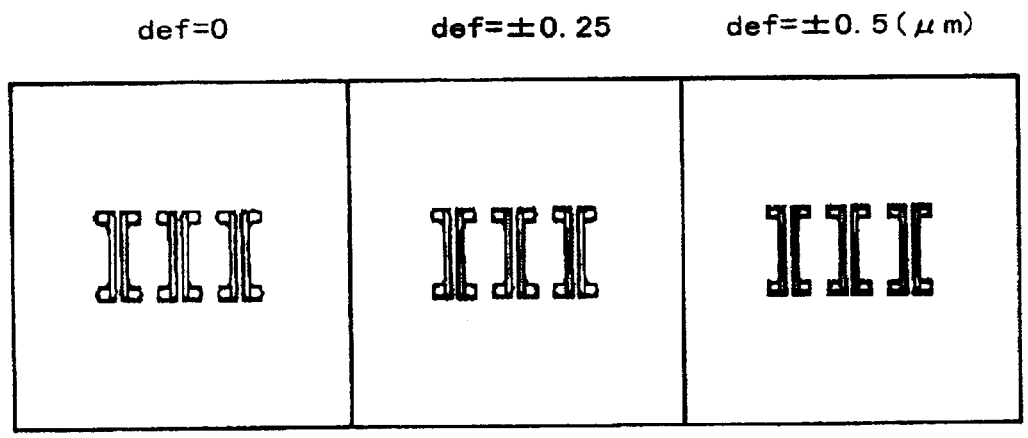
FIG. 9 is a schematic view of two-dimensional images resulting from exposures under an exposure condition for the standard exposure, before being optimized, for comparison with those shown in FIG. 10.

FIG. 9 illustrates a comparative example and shows two-dimensional images produced under the exposure condition not optimized for the standard exposure.

The exposure condition for the two-dimensional patterns (images) in the example shown in FIG. 10 is that, for a largest depth:

Periodic Pattern Exposure: NA=0.60, σ=0.10

Standard Exposure: NA=0.50, σ=0.96 (ring illumination) where NA is the numerical aperture of the projection optical system.

The exposure condition for the two-dimensional patterns (images) in the comparative example or FIG. 9 is that:

Periodic Pattern Exposure: NA=0.60, σ=0.10

Standard Exposure: NA=0.60, σ=0.80 (ring illumination) where NA is the numerical aperture of the projection optical system.

In the two-dimensional images in the comparative example of FIG. 9, images are well resolved with a defocus range of ±0.25 micron, and a depth of focus of 0.5 micron is obtained.

In the two-dimensional images of the example shown in FIG. 10, even if the thick line extending in a direction different from that of the periodic pattern is defocused, it does not become smaller as compared with the corresponding portion of FIG. 9, and thus the degradation is smaller. More fundamentally, degradation of two fine lines is small. This is because the two fine lines are not separated such that the two fine lines and the space therebetween function like a large pattern corresponding to three lines. Namely, with a 0.36 micron pattern corresponding to three linewidths, a larger depth of focus is obtainable with NA=0.50, than with NA=0.60. For this reason, the two-dimensional images are well resolved at the defocus range of 0.5 micron, and a depth of focus of 0.1 micron or more (twice the FIG. 9 example) is obtained. The depth of focus can be enlarged considerably. Further, the two-dimensional shape of each image is not degraded, and it is seen that the shape reproducibility is very good.

EXAMPLE 2

Figure 11:
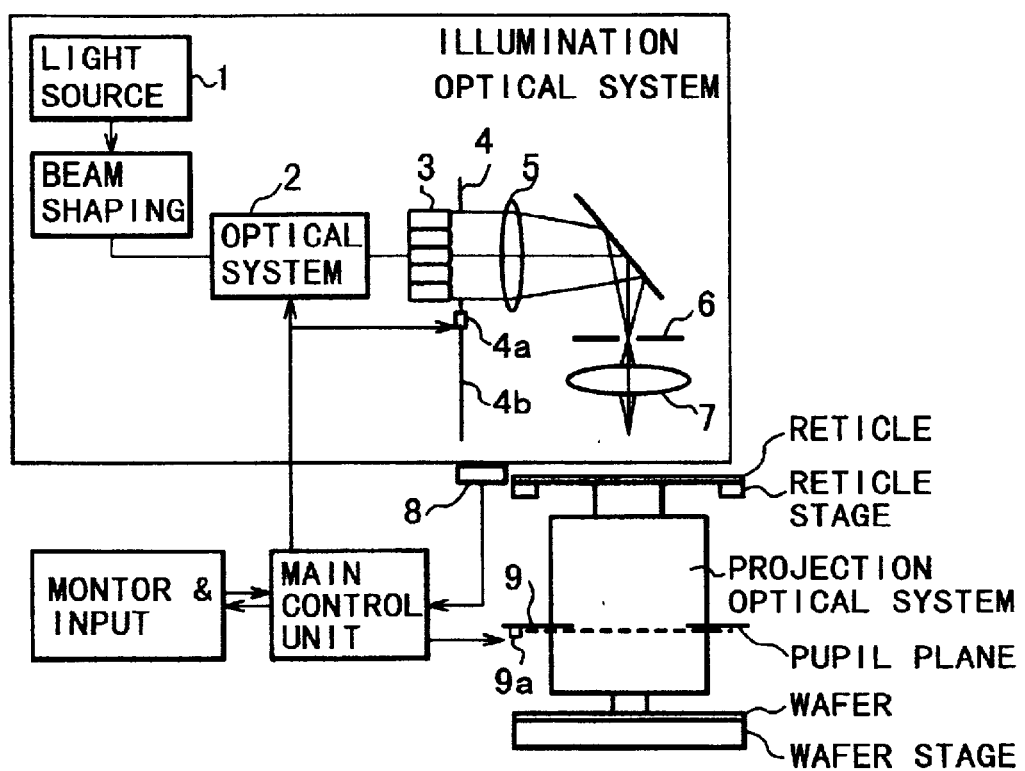
FIG. 11 is a schematic view of a projection exposure apparatus to be used with some embodiments of the present invention.

FIG. 11 shows a projection exposure apparatus used in this example. The projection exposure apparatus is arranged so that a reticle (mask) is illuminated by an illumination optical system including a light source, and a pattern of the reticle is projected, in a reduced scale, onto the surface of a wafer through a projection optical system, by which the wafer is exposed.

Denoted in FIG. 11 at 1 is a light source which comprises a pulse laser such as an excimer laser, for example. The pulse light emitted from the light source 1 is transformed by a beam shaping optical system into incoherent light having a predetermined shape. Denoted at 2 is an optical system which comprises a plurality of lenses and defines an a focal system being telecentric both on the light incidence side and the light exit side. This optical system is arranged to change magnifications of the a focal system to thereby change the beam sectional shape of the incident light, such as disclosed in Japanese Laid-Open Patent Application, Laid-Open No. 47639/1993. Alternatively, this optical system may comprise a zoom lens, for example, so that lenses are moved in the optical axis direction to change the angular magnification.

Denoted at 3 is an optical integrator which comprises a plurality of small lenses being arrayed two-dimensionally. Secondary light sources are defined at the light exit surface of the integrator Denoted at 4 is a variable stop, and it comprises various stops including an ordinary circular stop (FIG. 13), for changing the light intensity distribution on the pupil plane of the projection lens, for ring-like illumination or oblique incidence illumination, for example. In order to actuate the variable aperture stop, a disk-like turret plate having aperture openings formed therein is used. An aperture driving device 4a functions to rotate the turret to change the stops 4.

A plurality of light beams emitted from the secondary light sources, defined at the light exit surface of the optical integrator 3, are collected by a condensing lens 5 and, after being deflected by a mirror, they are incident on a masking blade 6. After passing it and an imaging lens 7, the light beams are projected on the reticle to uniformly illuminate a necessary region on the reticle surface.

Denoted at 8 is a bar code reader for reading a bar code on the reticle, in which information related to the reticle is recorded. Denoted at 9 is an aperture stop for restricting the NA of the projection optical system, and it is adjacent to the pupil plane of the projection optical system. By means of a stop driving unit 9a, the NA can be restricted.

The coherence factor σ of the illumination condition in this embodiment can be changed by means of the optical system 2 which constitutes the illumination optical system in this projection exposure apparatus. The coherence factor σ can be controlled to an optimum σ by selecting a stop of a shape such as shown in FIG. 13, as included in the aperture stops 4, thereby to interchange the stops for the periodic pattern exposure and the standard exposure. Alternatively, the shape of each stop of the aperture stop 4 as well as the coherence factor σ in FIG. 13 may be set to a possible largest σ, and the magnitude of the coherence factor σ may be changed by the optical system 1.

The exposure condition of the projection exposure apparatus may be memorized beforehand by storing, into a memory of a main control, a programmed sequence for the exposure method. In accordance with the exposure method sequence, the NA (exposure condition) and the illumination condition may be memorized. On the basis of the exposure condition, a signal may be applied to the aperture driving unit 9a of the projection optical system, to move the aperture stop to provide a predetermined NA. Also, on the basis of the illumination condition, a signal may be applied to the aperture control unit 4a of the illumination system, to rotate the aperture stop to define a predetermined effective light source. Further, a signal may be supplied to the optical system 1 so that, based on the illumination condition, a predetermined angular magnification of the optical system 1 is provided.

For example, if the procedure should be done in an order of the periodic pattern exposure and the standard exposure, a reticle 1 to be used for the periodic pattern exposure is loaded on a reticle stage, and the exposure is carried out with the NA and the σ suited for the periodic pattern exposure. Subsequently, a reticle 2 to be used for the standard exposure is loaded on the reticle stage, and the exposure is carried out superposedly, with the $NA_r$ and the $\sigma_r$ suited for the standard exposure.

Alternatively, information regarding the names of each reticle and the exposure conditions corresponding to them, respectively, may be stored into the memory of the main control unit. The bar code of a reticle in which the reticle name and the like are recorded may be read out by using the bar cod reader 8. After the reticle is loaded on the reticle stage, the numerical aperture NA and the sigma may be set to optimum values on the basis of the read information. Then, the exposure process may be carried out, under the optimum condition.

This example used an exposure apparatus having a KrF excimer laser as a light source (exposure wavelength λ=0.248 micron). In order to make the advantageous effects more clear, the exposure apparatus having a large coma aberration was used. In terms of equation (5) above, the coma aberration was 0.05λ. First, for exposure of a pattern of FIG. 12 having a smallest linewidth of 0.13 micron ($k_1$=0.315), in the periodic pattern exposure, a phase shift reticle having a periodic pattern such as shown in FIG. 17 was used. The projection optical system had an NA=0.60 and a sigma σ=0.20. As regards the standard exposure, a reticle 2 having a light blocking type pattern such as shown in FIG. 16 was used. The projection optical system was set to have an NA=0.60 and a sigma, σ=0.80. As shown in FIG. 18, superposed exposures were done. The exposures may be made in any order.

Figure 24:
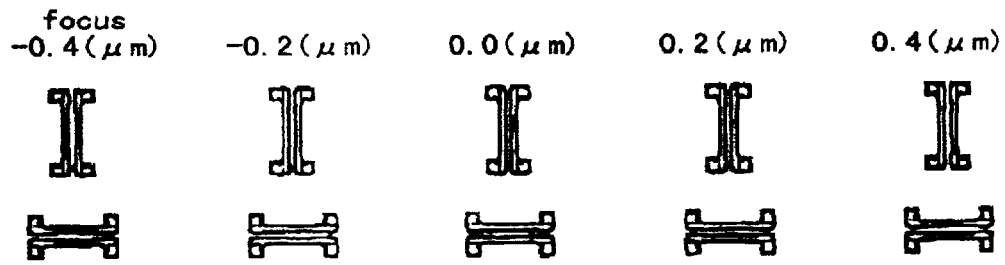
FIG. 24 shows images produced by the multiple exposure process, in the second embodiment of the present invention.

After the superposed exposures, a development process was done, by which images such as shown in FIG. 24 were produced on the wafer surface.

FIG. 24 shows images as focuses in the lateral direction. When $k_1$=0.5, since the focus with the NA=0.60 is 0.345 micron, the focus range of ±0.4 micron was set. The upper row shows patterns in a direction in which no aberration is produced. The lower row shows patterns in a direction in which aberration is produced. It is seen that, even in a pattern in the direction of coma aberration, substantially no degradation occurred in the shape.

Regardless of coma aberration of 0.05(λ), satisfactory images were obtained within the limit of the focus range ±0.345 micron ($k_2$±0.5).

Figure 23:
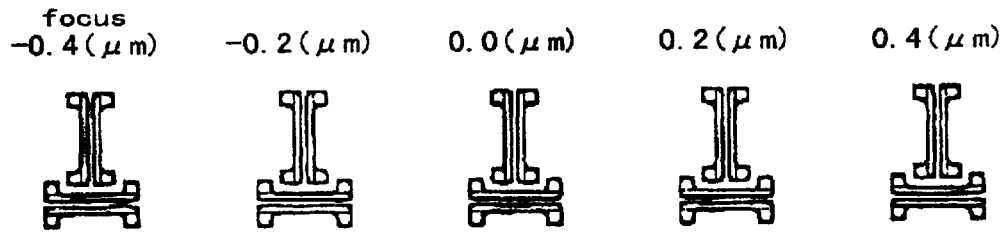
FIG. 23 shows images produced by the standard exposure process, for explaining a second embodiment of the present invention.

For comparison, in order to obtain the pattern of FIG. 12 having a smallest linewidth 0.20 micron ($k_1$=0.5), a single exposure of standard exposure was carried out. The exposure method was such that a reticle having a light blocking pattern of FIG. 16 was used, and NA=0.60 and σ=0.80. After the exposure, a development process was done, by which images such as shown in FIG. 23 were produced on the wafer surface. With the same aberration amount, for $k_1$=0.5 or more, good images are obtainable within the focus range ±0.345 micron ($k_2$=±0.5).

Figure 26:
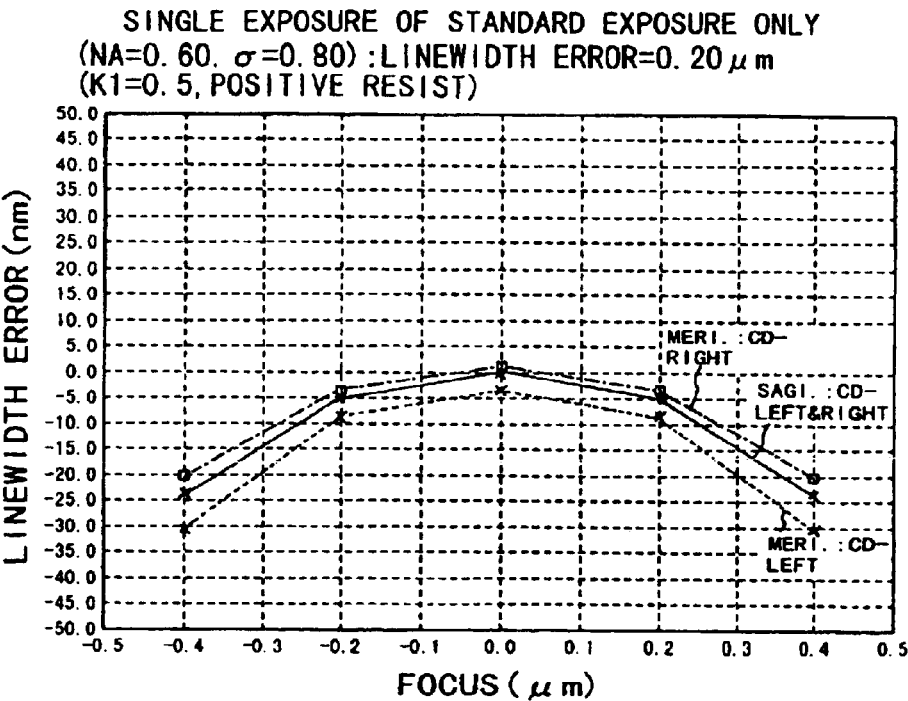
FIG. 26 is a graph for explaining the linewidth error and focus characteristic of an image by the standard exposure, in the second embodiment of the present invention.
Figure 27:
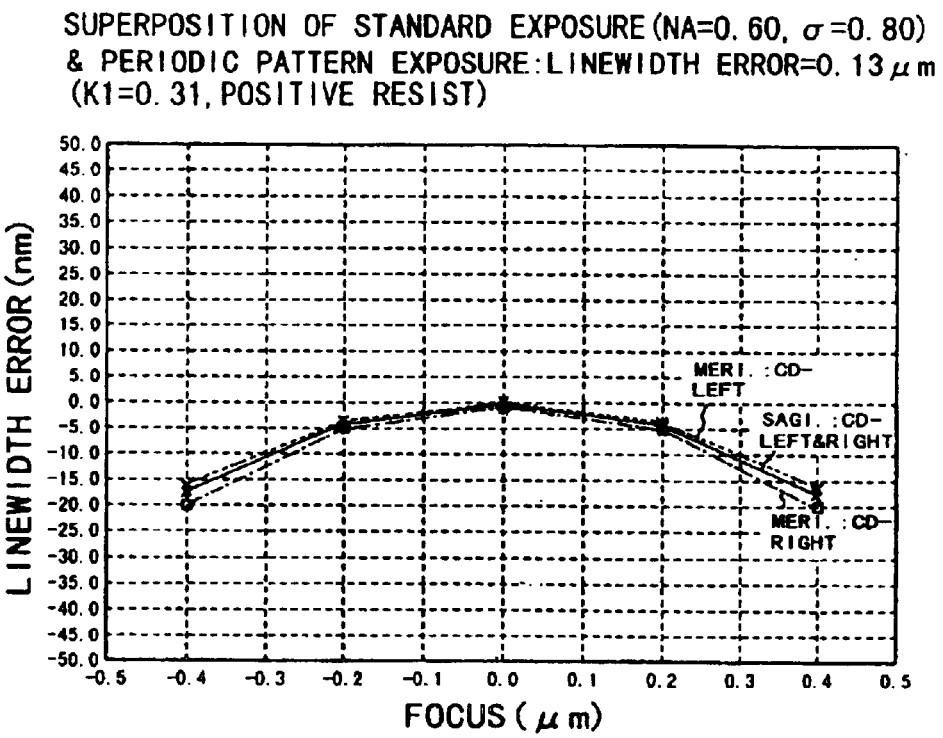
FIG. 27 is a graph for explaining the linewidth error and focus characteristic of an image by the multiple exposure, in the second embodiment of the present invention.

FIGS. 26 and 27 shows the results of a comparison made to these linewidth errors. Namely, from the two-dimensional images of standard exposure (FIG. 23) and the superposed exposures (FIG. 24), the linewidths were measured and plotted into graphs. In FIGS. 23 and 24, in relation to the exposure amount with which the linewidth of two, left and right lines in the upper row, extending in the direction in which no aberration occurs, was equal to 0.13 micron in the best focus, the linewidth of two, left and right lines in the bottom row, extending in the direction in which aberration was produced, was measured, and then the differences (linewidth errors) of them from 0.13 micron were calculated. The results are illustrated, while taking the focus on the axis of abscissa and taking the linewidth error (unit: nm) on the axis of ordinate.

FIG. 26 shows the linewidth error and focus characteristic of an image provided by a single exposure of standard exposure. Here, the linewidth error is 0.20 micron ($k_1$=0.5). FIG. 27 shows the linewidth error and focus characteristic of an image provided by superposition of the standard exposure and the periodic pattern exposure. Here, the linewidth error is 0.13 micron ($k_1$=0.31).

Comparing FIGS. 26 and 27, it is seen that the linewidth error is smaller in the superposed exposures of FIG. 27. Also, it is seen that, even by dividing the linewidth error by the linewidth, an approximately even proportion of linewidth error is provided. In both cases, the error is within the focus range of ±0.345 micron ($k_2$=±0.5), and the proportion obtainable by dividing the linewidth error by the linewidth is about −10%, which is quite practicable.

Therefore, it has been confirmed that, in accordance with the superposed exposures of standard exposure and periodic pattern exposure in this example, even if there is aberration, an image of $k_1=0.3$ to 0.4 can be produced equivalently to the image performance of an ordinary $k_1=0.5$ or more.

Figure 29:
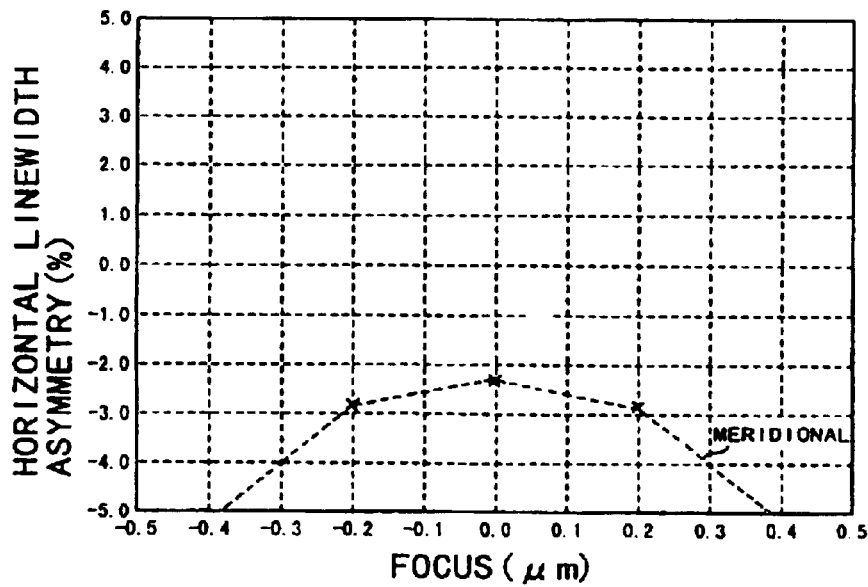
FIG. 29 is a graph for explaining the lateral linewidth asymmetry and focus characteristic by the standard exposure, in the second embodiment of the present invention.
Figure 30:
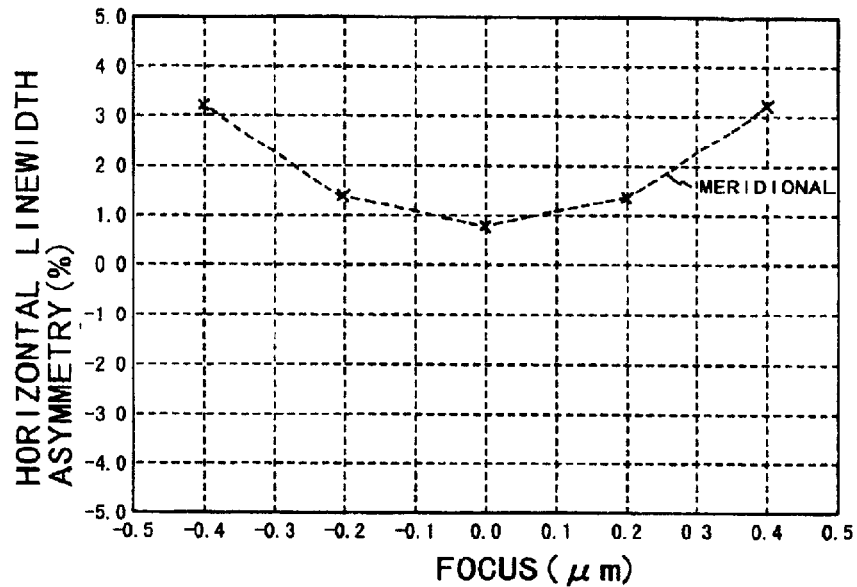
FIG. 30 is a graph for explaining the lateral linewidth asymmetry and focus characteristic by the multiple exposure, in the second embodiment of the present invention.

FIGS. 29 and 30 are graphs of a focus characteristic to lateral linewidth asymmetry in equation (3). FIG. 29 shows a case wherein a single exposure of standard exposure was done with NA=0.60 and σ=0.8. FIG. 30 shows a case wherein dual exposure of standard exposure NA=0.60 and σ=0.8 and periodic pattern exposure was done. It is seen that, at the best focus, the lateral linewidth asymmetry was 2% or more with the single exposure, but it was not greater than 1% with the dual exposure. Further, as regards the focus characteristic, in the ±0.4 micron best focus, there is an increase of 3% with the single exposure and about 2% with the dual exposure

EXAMPLE 3

Example 3 used the same exposure apparatus as that of Example 2. For exposure (resolution) of a pattern of FIG. 12 having a smallest linewidth 0.13 micron ($k_1=0.315$), in the periodic pattern exposure, a phase shift reticle having a periodic pattern such as shown in FIG. 17 was used. The projection optical system had an NA=0.60 and a sigma σ=0.20. As regards the standard exposure, a reticle 2 having a light blocking type pattern such as shown in FIG. 16 was used. The projection optical system was set to have an NA=0.48 and a sigma σ=1.0. As shown in FIG. 18, superposed exposures were done. The exposures may be made in any order.

Figure 25:
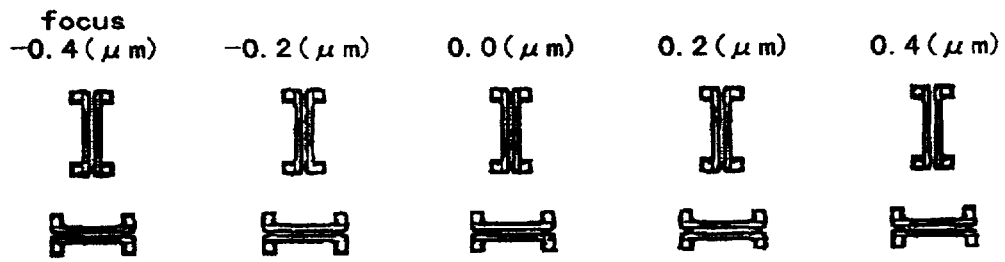
FIG. 25 shows images produced by the multiple exposure process, in the second embodiment of the present invention.

FIG. 25 shows two-dimensional images thus obtained. Like FIGS. 23 and 24, images obtained while changing the focus are illustrated. The upper row shows patterns in a direction in which no aberration is produced. The lower row shows patterns in a direction in which aberration is produced. It is seen that, even in a pattern in the direction of coma aberration, substantially no degradation occurred in the shape. Also, it is seen that, as compared with FIG. 24, the image performance is better.

Figure 28:
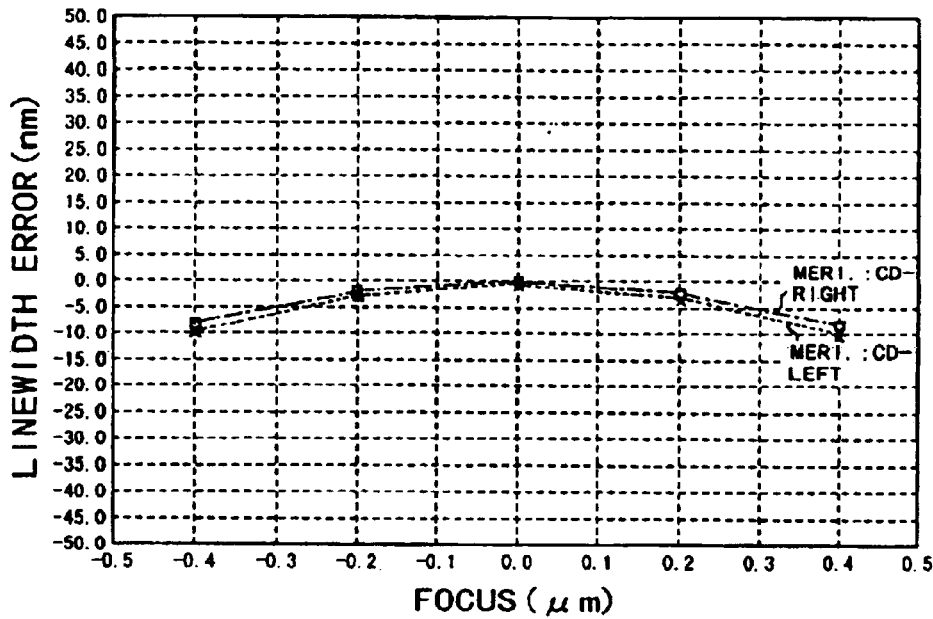
FIG. 28 is a graph for explaining the linewidth error and focus characteristic of an image by the multiple exposure, in a third embodiment of the present invention.

FIG. 28 shows the focus characteristic of the linewidth error, similarly to FIGS. 26 and 27. It is seen from FIG. 28 that, within the focus range ±0.345 micron ($k_1=±0.5$), the proportion obtainable by dividing the linewidth error by the linewidth is about −6%, and that the linewidth error is reduced.

Figure 31:
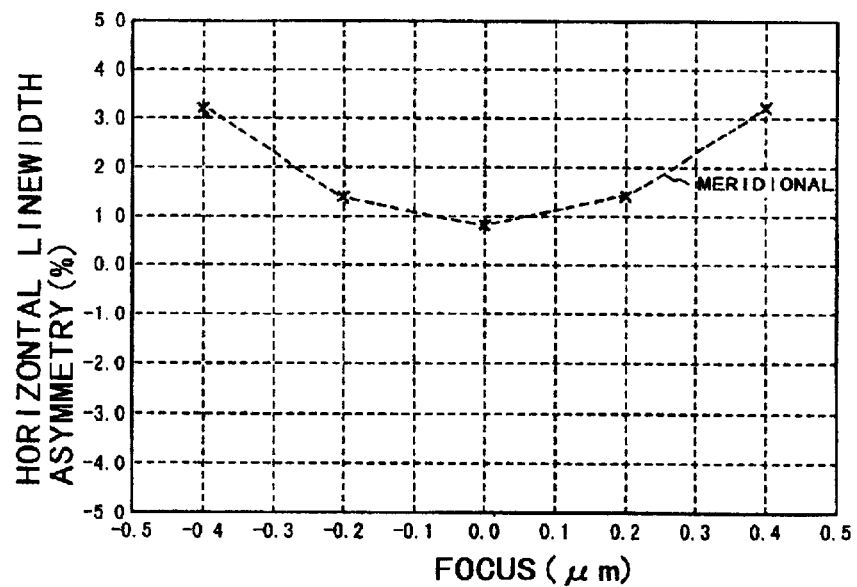
FIG. 31 is a graph for explaining the lateral linewidth asymmetry and focus characteristic by the multiple exposure, in the third embodiment of the present invention.

FIG. 31 is a graph, showing the focus characteristic of the lateral linewidth asymmetry in equation (3). It is seen that, at the best focus, the lateral linewidth asymmetry is not greater than 1%. Further, as regards the focus characteristic, in the ±0.4 micron best focus, there is an increase of only 2%. Thus, with the superposed exposures of standard exposure (restricted NA) and periodic pattern exposure, even if there is aberration, an image of $k_1=0.3$ to 0.4 can be produced much better than the image performance of ordinary $k_1=0.5$ or more.

While the examples have been described with reference to coma aberration, for any aberration, the superposed exposure process slows down the effect of aberration. The image performance is equivalent to that of $k_1=0.5$ to 0.6 in the single exposure. In other words, by use of an exposure apparatus with which a sufficient image performance is obtainable for a linewidth $k_1=0.5$ to 0.6, a pattern having a smallest linewidth of $k_1=0.3$ to 0.4 can be well resolved by the present invention.

An exposure method and an exposure apparatus according to any one of the preceding embodiments and examples may be applied to the manufacture of various devices such as semiconductor chips (e.g., IS or LSD, display devices such as a liquid crystal panel, detecting devices such as a magnetic head, or image pickup devices such as CCDs, for example.

The present invention is not limited to the embodiments and examples described above. It can be modified in various ways. Particularly, as regards the dual beam interference of a periodic pattern, use is not limited to a Levenson type mask. An edge shift type phase shift mask may be used. Alternatively, oblique illumination may be made to a binary mask, with similar advantageous effects. As regards the illumination condition for the oblique incidence illumination, the incidence range of illumination light having a local light source distribution for the oblique incidence illumination may be replaced by sigma, by which substantially the same advantageous effects are obtainable.

In accordance with the present invention, as described hereinbefore, satisfactory resolution is assured and, particularly, the depth of focus can be enlarged in accordance with the pattern to be resolved and the required depth. Further, even in a process of small $k_1$ factor, the influence of aberration to the image performance can be reduced. Thus, the present invention provides an exposure method, an exposure apparatus and/or a device manufacturing method, by which satisfactory resolution is assured.

While the invention has been described with reference to the structures disclosed herein, it is not confined to the details set forth and this application is intended to cover such modifications or changes as may come within the purposes of the improvements or the scope of the following claims.

What is claimed is:

1. A multiple-exposure method comprising the steps of:
    a first exposure step for exposing a substrate with a first pattern, by use of a projection optical system;
    a second exposure step for exposing the substrate with a second pattern, by use of the projection optical system,
    wherein the first exposure step uses a first mask having a first mask pattern including lines and spaces, while the second exposure step uses a second mask having a second mask pattern including lines and spaces;
    wherein a width of a line or a width of a space in a finest portion of the first mask pattern is made substantially equal to a width of a line or a width of a space in a finest portion of the second mask pattern,
    wherein the second mask pattern has a second portion in which a width of a line or a width of a space is larger than the width of the line or space in the finest portion of the second mask pattern,
    wherein in the first exposure step the finest portion of the first mask pattern is resolved, while in the second exposure step the finest pattern portion of the second mask pattern is not resolved but the second pattern portion of the second mask pattern is resolved,
    wherein a resultant pattern obtained on the basis of the finest portion of the first mask pattern and a resultant pattern obtained on the basis of the finest portion of the second mask pattern are superposed one upon another on the substrate, and
    wherein a numerical aperture NA2 of the projection optical system in the second exposure step is made smaller than a numerical aperture NA1 of the projection optical system in the first exposure step.

2. A method according to claim 1, wherein, when the numerical aperture NA1 is equal to the numerical aperture NA2, the first pattern exposure is performed with a substantially higher resolution and a substantially larger depth of focus, as compared with the second pattern exposure.

3. A method according to claim 2, wherein the numerical aperture NA2 satisfies the following relation:

$$0.7NA1 \leq NA2 < NA1.$$

4. A method according to claim 1, wherein the numerical aperture NA1 is determined in accordance with the following equation:

$$NA1 = k_1(\lambda/R) \text{ where } k_1 \geq 0.25,$$

wherein R is the length of a shorter one of a line and a space of a thinnest portion of a desired pattern, and $\lambda$ is the wavelength of light used for the first pattern exposure.

5. A method according to claim 4, wherein the numerical aperture NA1 corresponds to a largest numerical aperture of the projection optical system.

6. A method according to claim 1, wherein the first pattern exposure and the second pattern exposure are performed with different coherence factors $\sigma$.

7. A method according to claim 1, wherein, in the multiple exposure process, in accordance with a depth of focus required for resolution of a desired pattern, a combination of a coherence factor $\sigma_1$ and the numerical aperture NA1 of the projection optical system for the first pattern exposure and a combination of a coherence factor $\sigma_2$ and the numerical aperture NA2 of the projection optical system for the second pattern exposure are set, respectively.

8. A method according to claim 7, wherein the coherence factor $\sigma$, for the first pattern exposure is determined in accordance with a depth of focus required for resolution of a fine line of the width R.

9. A method according to claim 7, wherein, for a fine line having a normalized linewidth $k_1$, obtainable by dividing the width R of the fine line by ($\lambda$/NA1), being not greater than 0.4, the coherence factor $\sigma_1$ is made not greater than 0.3.

10. A method according to claim 7, wherein the numerical aperture NA2 is determined in accordance with a linewidth of a pattern included in the second pattern, the second pattern having a linewidth not smaller than the pitch of a periodic pattern of the first pattern and not being dependent upon the first pattern in the resolution.

11. A method according to claim 1, wherein the first pattern is constituted by a periodic pattern, a thin portion of which is resolvable, while the second pattern is constituted by a pattern having a thin portion, which is not resolvable, such that, in combination of them, an influence of aberration of the projection optical system is reduced.

12. A method according to claim 11, wherein the first pattern exposure uses coherent illumination, while the second pattern exposure uses incoherent illumination.

13. A method according to claim 11, wherein the periodic pattern includes a thin portion corresponding to a thin portion of a desired pattern and a periodic pattern defined at opposite sides of the thin portion.

14. A method according to claim 11, wherein, in the first pattern exposure, the following relations are satisfied:

$k_1 \leq 0.4$
$k_2 \geq 0.5$, where $k$, is a value obtainable by dividing, by $\lambda$/NA1, the length R of a shorter one a line and a spare of the thin portion, and $k_2$ is a value obtainable by dividing a focus amount d by $\lambda/NA1^2$, wherein $\lambda$ is the wavelength of light used for the exposure.

15. A method according to claim 14, wherein, when a phase shift mask is used for the first pattern exposure, the coherence factor $\sigma_1$ is made not greater than 0.3.

16. A method according to claim 11, wherein the second pattern exposure is based on a triple-beam interference imaging process.

17. A method according to claim 11, wherein the numerical aperture NA2 of the projection optical system for the second pattern exposure satisfies the following relation:

$$NA2 \leq 0.4 \times (\lambda/R),$$

where $\lambda$ is the wavelength of light used for the exposure, and R is the linewidth.

18. A method according to claim 11, wherein the numerical aperture NA2 of the projection optical system for the second pattern exposure satisfies the following relation:

$$NA2 \geq 0.5 \times (\lambda/R2),$$

where R2 is the linewidth of a portion of a desired pattern, excluding the thick portion not to be resolved by the second pattern exposure but to be resolved by the first pattern exposure, and $\lambda$ is the wavelength of light used for the exposure.

19. A method according to claim 1, wherein the first pattern is provided by one of a phase shift mask and a binary mask manufactured for exposure by a dual-beam interference process.

20. A method according to claim 1, wherein the second pattern exposure uses a mask having a pattern of a shape similar to a desired pattern.

21. A method according to claim 1, further comprising maximizing the coherence factor $\sigma_2$ for the second pattern.

22. A method according to claim 1, wherein, just before the first pattern exposure and the second pattern exposure, an optimum numerical aperture NA is set by changing an aperture diameter of a circular aperture at a pupil position of the projection optical system.

23. A method according to claim 1, wherein, just before the first pattern exposure and the second pattern exposure, one of an optical system of the projection optical system and a stop at a pupil position thereof is moved to set an optimum coherence factor $\sigma_1$ or $\sigma_2$.

24. A device manufacturing method, comprising the steps of:

exposing a wafer to a pattern of a reticle by use of an exposure method as recited in claim 1; and developing the exposed wafer.

25. An exposure method for performing exposure in relation to a particular pattern to be formed on a resist by use of a projection exposure apparatus, said method comprising:

a first exposure step for applying a first exposure amount distribution to the resist on the basis of a dual-beam interference exposure process; and a second exposure step using a mask having a predetermined mask pattern being analogous to the particular pattern, for applying to the resist a second exposure amount distribution including a first portion having a predetermined exposure amount other than zero and a second portion having an exposure amount-greater than the predetermined exposure amount, wherein the exposure of a first portion of the particular pattern is carried out on the basis of superposition of a portion of the first exposure amount distribution and the first portion of the second exposure amount distribution, while the exposure of a second portion of the particular pattern, different from the first portion of the particular pattern, is carried out on the basis of the second portion of the second exposure amount distribution as superposed with another portion of the first exposure amount distribution, and the numerical aperture of the projection exposure apparatus in the second exposure step is made smaller than that in the first exposure step.

26. A method according to claim 25, wherein the exposure process is performed in accordance with one of a first procedure in which the second step is carried out after the first step, a second procedure in which the first step is carried out after the second step, and a third procedure in which the first and second steps are carried out simultaneously.

27. A device manufacturing method, comprising the steps of:

exposing a wafer to a device pattern by use of an exposure method as recited in claim 26; and developing the exposed wafer.

28. An exposure method for performing exposure in relation to a particular pattern to be formed on a resist by use of a projection exposure apparatus, said method comprising:

a first exposure step for applying to the resist a first exposure amount distribution having an exposure amount not greater than an exposure threshold value of the resist, on the basis of a dual-beam interference exposure process using a first mask having at least one of a phase shifter and a light blocking portion; and a second exposure step using a second mask having a predetermined mask pattern being analogous to the particular pattern, for applying to the resist a second exposure amount distribution including a first portion having a predetermined exposure amount, other than zero but being not greater than the exposure threshold value of the resist, and a second portion having an exposure amount greater than the predetermined exposure amount, wherein the exposure of a first portion of the particular pattern is carried out on the basis of superposition of a portion of the first exposure amount distribution and the first portion of the second exposure amount distribution, while the exposure of a second portion of the particular pattern, different from the first portion of the particular pattern, is carried out on the basis of the second portion of the second exposure amount distribution as superposed with another portion of the first exposure amount distribution, and the numerical aperture of the projection exposure apparatus in the second exposure step is made smaller than in the first exposure step.

29. A method according to claim 28, wherein the exposure process is performed in accordance with one of a first procedure in which the second exposure step is carried out after the first exposure step, a second procedure in which the first exposure step is carried out after the second exposure step, and a third procedure in which the first and second exposure steps are carried out simultaneously.

30. An exposure method for performing exposure in relation to a particular pattern to be formed on a resist by use of a projection exposure apparatus, said method comprising:

a first exposure step for applying to the resist a first exposure amount distribution on the basis of a periodic pattern exposure process;

a second exposure step using a second mask having a predetermined mask pattern being analogous to the particular pattern, for applying to the resist a second exposure amount distribution including a first portion having a predetermined exposure amount other than zero and a second portion having an exposure amount greater than the predetermined exposure amount;

wherein the exposure of a first portion of the particular pattern is carried out on the basis of superposition of a portion of the first exposure amount distribution and the first portion of the second exposure amount distribution, while the exposure of a second portion of the particular pattern, different from the first portion of the particular pattern, is carried out on the basis of the second portion of the second exposure amount distribution as superposed with another portion of the first exposure amount distribution, and the numerical aperture of the projection exposure apparatus in the second exposure step is made smaller than in the first exposure step.

31. A method according to claim 30, wherein the exposure process is performed in accordance with one of a first procedure in which the second exposure step is carried out after the first exposure step, a second procedure in which the first exposure step is carried out after the second exposure step, and a third procedure in which the first and second exposure steps are carried out simultaneously.

32. An exposure method for performing exposure in relation to a particular pattern to be formed on a resist by use of a projection exposure apparatus, said method comprising:

a first exposure step for applying to the resist a first exposure amount distribution having an exposure amount not greater than an exposure threshold value of the resist, on the basis of a periodic pattern exposure process using a first mask having at least one of a phase shifter and a light blocking portion;

a second exposure step using a second mask having a predetermined mask pattern being analogous to the particular pattern, for applying to the resist a second exposure amount distribution including a first portion having a predetermined exposure amount, other than zero but not greater than the exposure threshold value of the resist, and a second portion of an exposure amount greater than the predetermined exposure amount, wherein the exposure of a first portion of the particular pattern is carried out on the basis of superposition of a portion of the first exposure amount distribution and the first portion of a second portion of the particular pattern, different from the first portion of the particular pattern, is carried out on the basis of the second portion of the second exposure amount distribution as superposed with another portion of the first exposure amount distribution, and the numerical aperture of the projection exposure apparatus in the second exposure step is made smaller than that in the first exposure step.

33. A method according to claim 32, wherein the exposure process is performed in accordance with one of a first procedure in which the second exposure step is carried out after the first exposure step, a second procedure in which the first exposure step is carried out after the second exposure step, and a third procedure in which the first and second exposure steps are carried out simultaneously.

* * * * *

UNITED STATES PATENT AND TRADEMARK OFFICE
CERTIFICATE OF CORRECTION

PATENT NO. : 6,780,574 B2
APPLICATION NO. : 09/796541
DATED : August 24, 2004
INVENTOR(S) : Miyoko Kawashima It is certified that error appears in the above-identified patent and that said Letters Patent is hereby corrected as shown below:

COLUMN 4:
        Line 6, "provide" should read -- provided --.
        Line 20, "as the" should read -- as that of the --.

COLUMN 5:
        Line 27, the second occurrence of "is required" should be deleted.

COLUMN 6:
        Line 29, "$C8(3r^3-2r)\sin\theta$" should read -- $C8 = (3r^3-2r)\sin\theta$ --.

COLUMN 9:
        Line 43, "comprising;" should read -- comprising: --.

COLUMN 10:
        Line 35, "of;" should read -- of: --.

COLUMN 13:
        Line 50, "k," should read -- $k_1$ --.

COLUMN 14:
        Line 7, "$k_1 0.4$" should read -- $k_1=0.4$ --.

COLUMN 15:
        Line 37, "above:" should read -- above. --.

COLUMN 16:
        Line 67, "has" should read -- have --.

COLUMN 17:
        Line 20, "on" should read -- one --.

COLUMN 21:
        Line 16, "of" should read -- or --.
        Line 26, "a" should read -- having a --.

COLUMN 22:
        Line 47, "a focal" should read -- afocal --.
        Line 59, "integrator" should read -- integrator. --.

UNITED STATES PATENT AND TRADEMARK OFFICE
CERTIFICATE OF CORRECTION

PATENT NO. : 6,780,574 B2
APPLICATION NO. : 09/796541
DATED : August 24, 2004
INVENTOR(S) : Miyoko Kawashima It is certified that error appears in the above-identified patent and that said Letters Patent is hereby corrected as shown below:

COLUMN 25:
    Line 15, "exposure" should read -- exposure. --

COLUMN 27:
    Line 29, "σ," should read -- $\sigma_1$ --.
    Line 60, "k," should read -- $k_1$ --.
    Line 61, "one" should read -- one of -- and "spare" should read -- space --.

COLUMN 28:
    Line 60, "amount-greater" should read -- amount greater --.

COLUMN 30:
    Line 48, "of a second portion" should read -- of the second exposure amount distribution, while the exposure of a second --.

Signed and Sealed this

Fifth Day of June, 2007

JON W. DUDAS
*Director of the United States Patent and Trademark Office*